US005610790A

United States Patent [19]
Staab et al.

[11] Patent Number: 5,610,790
[45] Date of Patent: Mar. 11, 1997

[54] METHOD AND STRUCTURE FOR PROVIDING ESD PROTECTION FOR SILICON ON INSULATOR INTEGRATED CIRCUITS

[75] Inventors: David R. Staab, San Jose; Sheau-Suey Li, Cupertino, both of Calif.

[73] Assignee: Xilinx, Inc., San Jose, Calif.

[21] Appl. No.: 376,163

[22] Filed: Jan. 20, 1995

[51] Int. Cl.$^6$ .................................................. H02H 9/00
[52] U.S. Cl. ................................ 361/56; 361/91; 361/111
[58] Field of Search ................................ 361/56, 58, 91, 361/117, 118, 127, 111

[56] References Cited

U.S. PATENT DOCUMENTS

| | | | |
|---|---|---|---|
| 4,037,140 | 7/1977 | Eaton, Jr. | 361/56 |
| 4,282,556 | 8/1981 | Ipri | 361/56 |
| 4,794,437 | 12/1988 | Palumbo | 357/23.13 |
| 4,989,057 | 1/1991 | Lu | 357/23.7 |
| 4,996,626 | 2/1991 | Say | 361/91 |
| 5,041,889 | 8/1991 | Kriedt et al. | 357/23.13 |
| 5,124,877 | 6/1992 | Graham | 361/212 |
| 5,210,442 | 5/1993 | Ishimoto | 257/679 |
| 5,223,444 | 6/1993 | Mosser et al. | 437/21 |
| 5,264,723 | 11/1993 | Strauss | 257/532 |
| 5,283,449 | 2/1994 | Ooka | 257/204 |
| 5,311,391 | 5/1994 | Dungan et al. | 361/56 |

FOREIGN PATENT DOCUMENTS

| | | | |
|---|---|---|---|
| 58-222573 | 4/1984 | Japan | H01L 29/78 |

OTHER PUBLICATIONS

Palumbo, William and M. Patrick Dugan, "Design and Characterication of Input Protection Networks For CMOS/SOS Applications," EOS/ESD Symposium Proceedings, 1986, pp. 182–187.

Whitehead, J. P. and N. N. Duncan, "Design and Evaluation of CMOS SOS On–Chip Input Protection Circuits," GEC Research Ltd., United Kingdom (date unknown) pp. 4.2.1 through 4.3.

Chan et al., "Comparison of ESD Protection Capability of SOI and BULK CMOS Output Buffers," IEEE/RPS, Catalog No. 94CH3332–4, 1994, pp. 292–298.

Cohen, Seymour and Gregory Caswell, "An Improved Input Protection Circuit for C–MOS/SOS Arrays," IEEE Trans. on Electron Devices, vol. Ed.25, No. 8, Aug., 1975, pp. 926–931.

*Primary Examiner*—Jeffrey A. Gaffin
*Assistant Examiner*—Stephen Jackson
*Attorney, Agent, or Firm*—Skjerven, Morrill, MacPherson, Franklin & Friel; Jeanette S. Harms

[57] ABSTRACT

A method and structure for providing ESD protection for Silicon-On-Insulator (SOI) integrated circuits. The ESD protection circuit includes an electrically conductive pad and first conductor segment fabricated over an insulating layer. The first conductor segment connects the pad directly to a first node, without an intervening input resistor. A first diode is fabricated over the insulating layer and connected between the first node and a first voltage supply rail. Similarly, a second diode is fabricated over the insulating layer and connected between the first node and a second voltage supply rail. Ballast resistors can be included in series with each of the diodes. A cross power supply clamp, also fabricated over the insulating layer, is connected between the first and second voltage supply rails. The first node of the ESD protection circuit is coupled to the SOI integrated circuit to be protected. The ESD protection circuit can be fabricated on a minimum number of silicon islands to improve local thermal spreading. Improved ESD protection is provided to input, output, and I/O pins of an SOI integrated circuit, while promoting high speed signal transfer between these pins and the integrated circuit.

37 Claims, 18 Drawing Sheets

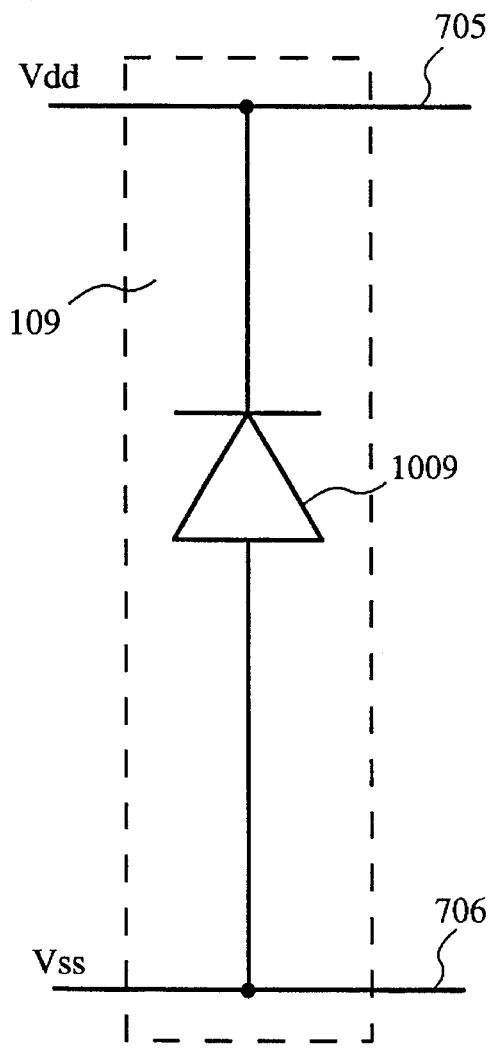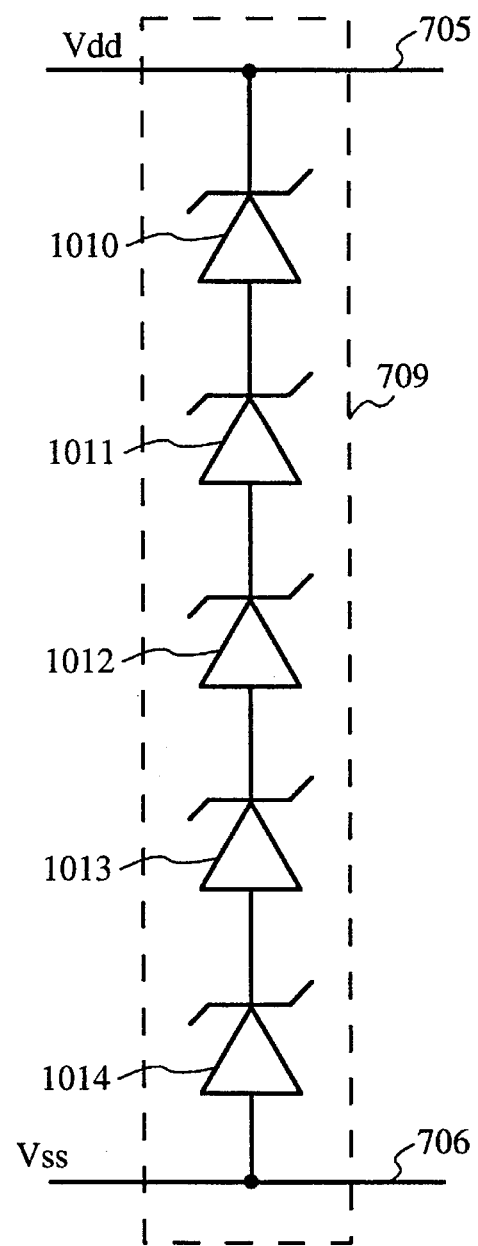
FIG. 10d
FIG. 10e

METHOD AND STRUCTURE FOR PROVIDING ESD PROTECTION FOR SILICON ON INSULATOR INTEGRATED CIRCUITS

BACKGROUND OF THE INVENTION

1. Field of the Invention

The present invention relates to electrostatic discharge protection for an integrated circuit, and more specifically, to a method and structure for providing ESD protection for an integrated circuit fabricated in accordance with silicon on insulator technology.

2. Description of the Related Art

FIG. 1 is a schematic diagram of a conventional integrated circuit electrostatic discharge (ESD) device 100 which is coupled between input pad 101 and integrated circuit logic circuitry 102. ESD device 100 includes a resistor 103 and an n-channel field effect transistor 104 coupled in series between input pad 101 and Vss voltage supply terminal 105. Vdd voltage supply terminal 106 is coupled to the substrate on which transistor 104 is fabricated, thereby forming diode 107 between Vdd voltage supply terminal 106 and Vss voltage supply terminal 105. ESD device 100 protects integrated circuit logic circuitry 102 by providing current paths through transistor 104 and diode 107 when high positive or negative voltages (relative to the normal operating voltages of Vss and Vdd voltage supply terminals 105, 106) exist on input pad 101, Vss voltage supply terminal 105 or Vdd voltage supply terminal 106.

FIG. 2 is a cross sectional view of transistor 104, including p-substrate 200, n type drain region 201, n type source region 202, gate oxide 203, gate electrode 204, p type substrate contact region 205 and n type diffusion contact region 207. Because transistor 104 is fabricated in bulk silicon (i.e., substrate 200), a parasitic P/N junction exists between substrate 200 and drain region 201. Consequently, if a high voltage is applied to Vss voltage supply terminal 105 (with respect to the voltage applied to input pad 101), an electrically conductive path is formed between Vss voltage supply terminal 105 and input pad 101 through this parasitic P/N junction and resistor 103. This electrically conductive path allows a high current to flow between Vss voltage supply terminal 105 and input pad 101 without damaging logic circuitry 102. Transistor 104 also turns on during these conditions, providing an alternate path between Vss voltage supply terminal 105 and input pad 101.

Additionally, if a high voltage is applied to Vdd voltage supply rail 106 (with respect to the voltage applied to input pad 101), current will flow from n type region 207 to n type region 201 through p-substrate 200 (with the P/N junction formed by region 207 and substrate 200 being operated in reverse breakdown mode). Similarly, if a high voltage is applied to input pad 101 (with respect to the voltage applied to Vdd voltage supply rail 106), current will flow from n type region 201 to n type region 207 through p—substrate 200 (with the P/N junction formed by region 201 and substrate 200 being operated in reverse breakdown mode).

Thus, parasitic P/N junctions formed in devices fabricated in bulk silicon (hereinafter referred to as bulk devices) are useful in providing ESD protection at the input terminals of integrated circuits. However, in utilizing parasitic P/N junctions to provide ESD protection, unpredictable results are sometimes obtained because the circuit designer may not understand the relationships between all of the parasitic P/N junctions present within a circuit.

FIG. 3 is a cross sectional view of an n-channel transistor 300 fabricated in accordance with conventional silicon on insulator (SOI) technology (hereinafter referred to as an SOI transistor or an SOI device). SOI transistor 300 includes insulating substrate 306 on which is formed a thin layer of silicon 310. N type drain region 301, p-type channel region 302 and n type source region 303 are formed in silicon layer 310. Gate oxide 304 and gate electrode 305 are fabricated over silicon layer 310. Insulating substrate 306 is typically sapphire or silicon dioxide ($SiO_2$). Because transistor 300 is fabricated on insulating substrate 306, no parasitic P/N junctions exist in transistor 300. The lack of a parasitic P/N junction in SOI transistor 300 prevents SOI transistor 300 from operating in the same manner as ESD device 100 (FIGS. 1 and 2) to provide ESD protection.

SOI devices have lateral P/N junctions which are formed between adjacent regions (e.g., regions 301 and 302) of a thin silicon layer (e.g., silicon layer 310). For a given silicon surface area, these lateral P/N junctions are typically much smaller in area than conventional vertical P/N junctions, which conduct both laterally and vertically. As a result, a lateral P/N junction typically cannot carry the same amount of current as vertical P/N junction for the same silicon surface area. This inherent limitation of SOI technology has contributed to the problem of providing ESD protection for SOI devices.

Several alternatives have been attempted to provide adequate ESD protection for SOI devices. In one alternative, an insulating layer of $SiO_2$ is formed along the upper surface of a bulk silicon substrate. SOI devices are then fabricated on the $SiO_2$ layer. Openings are formed in the $SiO_2$ layer, and conventional ESD protection devices are fabricated in the underlying bulk silicon. (See, e.g., Chan et al., "Comparison of ESD Protection Capability of SOI and BULK CMOS Output Buffers", 1994 IEEE International Reliability Physics Proceedings. pp. 292–298) This alternative disadvantageously requires the use of an underlying silicon substrate and introduces additional processing steps, thereby increasing fabrication costs.

FIG. 4 illustrates another conventional SOI ESD protection circuit 400. (See, e.g., J. P. Whitehead and N. N. Duncan, "Design and Evaluation of CMOS-SOS On-Chip Input Protection Circuits", Electrostatic Discharge Damage in Electronics—Seminar Proceedings (1986) P.4.2/1–10.). Protection circuit 400 includes input resistor 402, protection diodes 403 and 404, and spark gap circuit 409. P-channel field effect transistor 407 and n-channel field effect transistor 408 form the input buffer (i.e., an inverter) to circuit 411. Each of transistors 407 and 408 is an SOI device. Input resistor 402, located between input pad 401 and node 410 of circuit 400, typically has a resistance greater than 1000 ohms to ensure power consumption during an ESD event and reduce the voltage provided at node 410. As a result, voltage stress on the gate oxide of transistors 407 and 408 and on circuit 411 is reduced. (See, e.g., Cohen and Caswell, "An Improved Input Protection Circuit for C-MOS/SOS Arrays", IEEE Transactions on Electron Devices, Vol. ED. 25, No. 8, Aug. 1978, pp 926–933; and W. Palumbo and M. P. Dugan, "Design and Characterization of Input Protection Networks for CMOS/SOS Applications", 1986 Electrical Overstress/Electrostatic Discharge Symposium Proceedings, (1986) pp. 182–187).

Input resistor 402 is typically a polysilicon resistor formed between two layers of $SiO_2$. Because $SiO_2$ is a poor thermal conductor, the high current carried by polysilicon input resistor 402 causes overheating, which in turn damages the resistor. Thus, input resistor 402 is a common failure point in SOI ESD protection circuit 400.

Moreover, because input resistor 402 is connected in series with the gates of transistors 407 and 408, input resistor 402 introduces an RC time delay to input signals applied to input pad 401 during normal operation of circuit 411. Such an RC time delay is undesirable in high speed circuits.

Spark gap circuit 409 dissipates a portion of the transient energy of an ESD event by allowing ESD current to arc from input pad 401 to ground supply rail 406 through spark gap circuit 409. Spark gap circuit 409 typically includes a pair of metal electrodes which are separated by free space and are substantially surrounded by layers of silicon dioxide ($SiO_2$). Because $SiO_2$ is a poor thermal conductor, excess heat can build up around spark gap circuit 409 during an ESD event, thereby causing damage to spark gap circuit 409. Spark gap circuit 409 is not an ideal element because optimal gap spacing and geometries are difficult to determine. Moreover, arcing is at least partially destructive to spark gap circuit 409, thereby reducing the effectiveness of spark gap circuit 409 during subsequent ESD events. Despite the shortcomings of spark gap circuit 409, ESD protection for SOI devices has been historically so troublesome that considerable attention has been devoted to the design and inclusion of spark gap circuits (See, e.g., U.S. Pat. No. 4,794,437, "Arc Gap for Integrated Circuits" by Palumbo).

Protection diodes 403 and 404 are either gated or non-gated lateral diodes. FIG. 5 shows an illustrative non-gated lateral SOI diode 500, which includes a silicon layer 510 fabricated on insulating layer 501. Silicon layer 510 includes p type region 502, n type region 503 and center region 504. Center region 504 can be an n-region, a p-region or an undoped region.

FIG. 6 shows an illustrative gated diode 600, which includes a silicon layer 610 fabricated on insulating layer 601. Silicon layer 610 includes p type region 602, n-type region 603 and center region 604. Center region 604 is an n-region, a p-region or an undoped region. Gate oxide 605 and gate electrode 606 are fabricated over silicon layer 610 as illustrated. Gate electrode 606 is either connected to n type region 603 (as illustrated), connected to p type region 602, or is connected to another circuit node.

If gated lateral diode 600 is used for diodes 403 and 404 (FIG. 4) in protection circuit 400, gate electrode 606 capacitively loads input pad 401. The lateral P/N junction of diode 600 also places a small capacitive load on input pad 401. (The lateral P/N junction of non-gated lateral diode 500 similarly introduces a small capacitive load). Thus, input resistor 402, connected in series with this capacitive load, introduces an RC delay to signals applied to input pad 401, thereby degrading the performance of circuitry connected to ESD protection circuit 400.

In the implementation of protection circuit 400, a relatively large area is devoted to spark gap circuit 409 and input resistor 402 compared to the area devoted to protection diodes 403 and 404. Spark gap circuit 409 and input resistor 402 each typically consumes approximately twice as much area as diodes 403 and 404. To minimize the area of circuit 400 and to minimize the capacitive loading associated with protection diodes 403 and 404, the sizes of lateral diodes 403 and 404 are kept relatively small, generally less than 200 μm in lateral width.

Certain prior art SOI ESD protection circuits have a number of zener diodes connected in series between the Vdd and Vss voltage supply rails. (See, e.g., Cohen and Caswell, "An Improved Input Protection Circuit for C-MOS/SOS Arrays", IEEE Transactions on Electron Devices, Vol. ED. 25, No. 8, Aug. 1978, pp 928). Five series zener diodes are connected such that the zener diodes conduct in reverse breakdown mode during the relevant ESD events. The five series zener diodes must be five times wider than a single protection diode to provide the same current carrying capacity with the same voltage drop. The zener diodes therefore consume considerable layout area and are consequently expensive to implement on an IC in a distributed fashion.

In bulk devices, output pins and input/output (I/O) pins are somewhat self-protecting because of parasitic P/N junctions present in the output buffers of bulk devices. The parasitic P/N junctions present in these output buffers operate to protect the output buffers in a manner similar to that described above in connection with FIGS. 1 and 2. The output pins and I/O pins of SOI devices are generally not self-protecting because the output buffers of SOI devices lack parasitic P/N junctions. Furthermore, SOI devices have potentially higher transistor drain-to-source breakdown voltages than bulk devices (because the deep channel breakdown path typically available in bulk devices is not present in SOI devices). In spite of this, no output buffer ESD protection schemes are taught for prior art SOI devices.

Therefore, a need arises for an SOI ESD protection circuit which (1) effectively protects SOI integrated circuits from high voltage related stress, (2) minimizes additional process complexities, (3) can withstand a series of ESD events with minimal degradation in the level of ESD protection, (4) minimizes input, output, and I/O pin path delay, (5) minimizes damaging effects of localized heating during an ESD event, (6) avoids excessive physical area requirements, (7) provides protection for ESD events which occur across the voltage supply rails, and (8) equals or exceeds the performance of bulk MOS ESD protection circuits (i.e., approximately 2000 volts in a conventional human body model test) without exposure to the design risk of unpredictable results often obtained by using bulk parasitic elements.

SUMMARY OF THE INVENTION

Accordingly, the present invention provides an SOI ESD protection circuit with the above-mentioned advantages. An ESD protection circuit in accordance with the present invention includes an electrically conductive pad and a first conductor segment fabricated over an insulating layer. The first conductor segment connects the pad directly to a first node without an intervening input resistor. A first diode is fabricated over the insulating layer and connected between the first node and a Vdd voltage supply rail, such that the first diode is forward biased by a positive voltage applied to the first node with respect to the voltage on the Vdd voltage supply rail. Similarly, a second diode is fabricated over the insulating layer and connected between the first node and a Vss voltage supply rail, such that the second diode is forward biased by a positive voltage applied to the Vss voltage supply rail with respect to the voltage on the first node. From the first node, ballast resistors can be included in series with the first and second diodes.

A cross power supply clamp, also fabricated over the insulating layer, is connected between the first and second voltage supply rails. The cross power supply clamp can include, for example, a plurality of n-channel transistors, each having a source and gate electrode coupled to the Vss voltage supply rail and a drain coupled to the Vdd voltage supply rail. The cross power supply clamp can also include other configurations of n-channel transistors, p-channel transistors and diodes.

In one embodiment, the first node of the ESD protection circuit is directly connected to an input buffer of the SOI integrated circuitry to be protected. This advantageously eliminates any input resistors from the signal path between the pad and the protected integrated circuitry. As a result, RC delay along this path is greatly reduced.

In another embodiment, the ESD protection circuit includes a resistor coupled between the first node and an input buffer of the integrated circuitry to be protected. A second node is located between the resistor and the input buffer. A third diode is connected between the second node and the Vdd voltage supply rail, and a fourth diode is connected between the second node and the Vss voltage supply rail. The resistor used in this ESD protection circuit has a lower resistance than conventional input resistors. As a result, the RC delay of signals transmitted from the pad to the input buffer is greatly reduced.

In yet another embodiment, the first node of the ESD protection circuit is coupled to an output buffer of the integrated circuit through one or more resistors, thereby providing protection to the output buffer of the integrated circuit.

In a further embodiment, the first node of the ESD protection circuit is coupled to (1) an input buffer of the integrated circuit, and (2) an output buffer of the integrated circuit through one or more resistors. This provides ESD protection to the input buffer, the output buffer and the integrated circuit.

The above described ESD protection circuits effectively protect SOI integrated circuitry from high voltage related stress for ESD events, including ESD events which occur across the voltage supply rails.

Because the elements of the ESD protection circuit are fabricated over the insulating layer in accordance with SOI techniques, the complexity of the process required to fabricate the ESD protection circuit is not increased. Moreover, because of the relatively small layout area associated with SOI devices, the physical layout requirements of the ESD protection circuit are not excessive. Furthermore, because no spark gap circuit is required, the ESD protection circuit can withstand a series of ESD events with minimal degradation in the level of ESD protection.

In one embodiment, the elements of the ESD protection circuit are fabricated on a single silicon island on the insulating layer or distributed on a minimum number of separate silicon islands to improve local thermal spreading. By combining the elements of the ESD protection circuit on a minimum number of separate silicon islands, the damaging effects of localized heating during an ESD event are minimized.

The present invention also provides a method for providing ESD protection for an SOI integrated circuit. This method includes the steps of (1) connecting an input pad directly to an input buffer of the SOI integrated circuit, (2) conducting current from the input pad to a first voltage supply rail through a forward biased SOI diode when a voltage applied to the input pad is positive with respect to a voltage applied to the first voltage supply rail, (3) conducting current from a second voltage supply rail to the input pad through a forward biased SOI diode when a voltage applied to the input pad is negative with respect to a voltage applied to the second voltage supply rail, (4) conducting current from the first voltage supply rail to the second voltage supply rail through a cross power supply clamp when a voltage applied to the input pad is negative (and greater than normal operating voltages) with respect to a voltage applied to the first voltage supply rail, and (5) conducting current from the first voltage supply rail to the second voltage supply rail through the cross power supply clamp when a voltage applied to the input pad is positive with respect to a voltage applied to the second voltage supply rail.

The present invention will be more fully understood in light of the following detailed description taken together with the drawings.

BRIEF DESCRIPTION OF THE DRAWINGS

FIGS. 10a–10j are schematic diagrams of a cross power supply clamps in accordance with the invention;

DETAILED DESCRIPTION OF THE INVENTION

Figure 7:
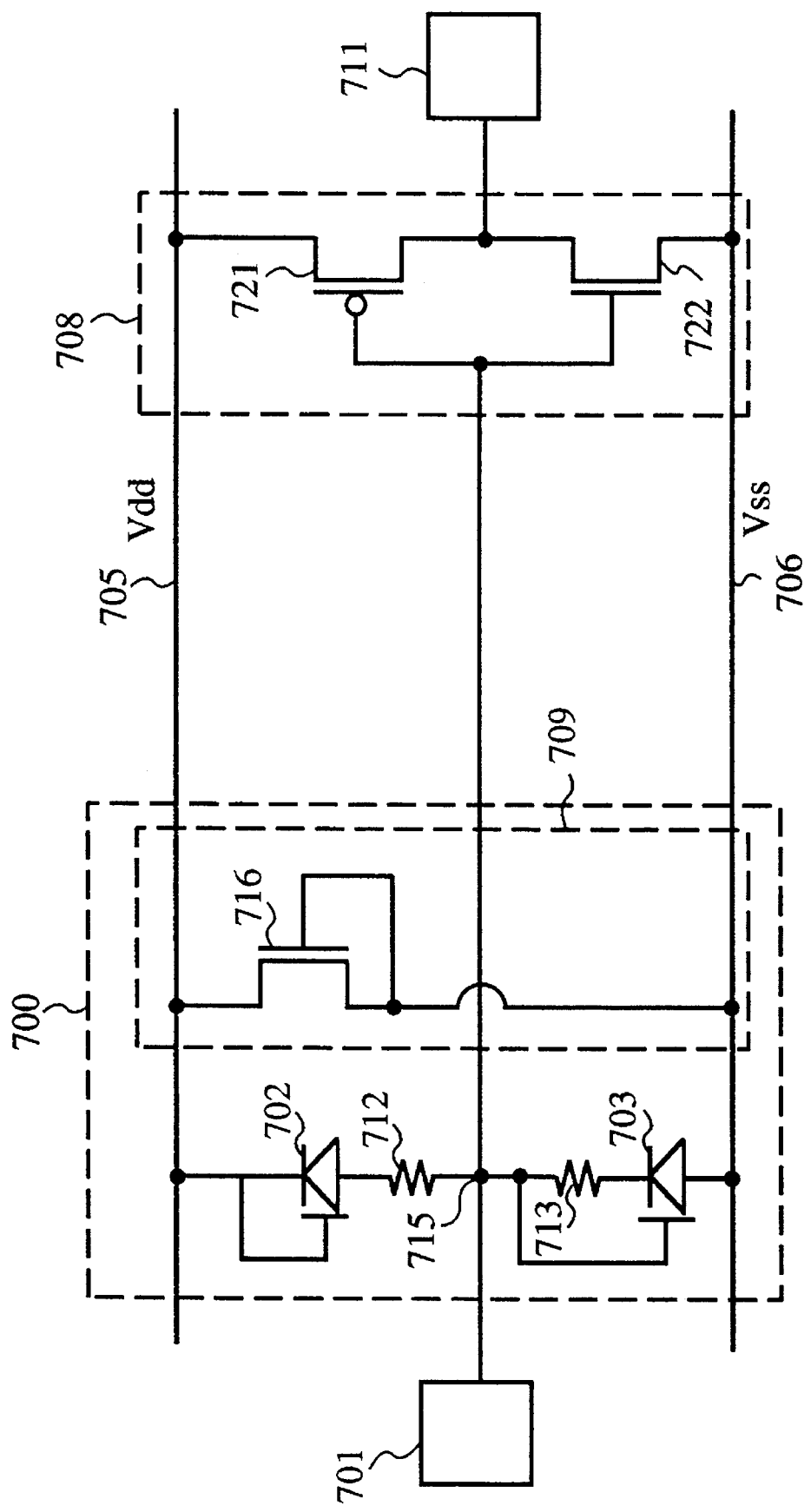
FIG. 7 is a schematic diagram of an SOI ESD protection circuit in accordance with the invention.

FIG. 7 illustrates one embodiment of an SOI ESD protection circuit 700 in accordance with the present invention which includes electrically conductive input pad 701, primary gated diodes 702 and 703, diode anode ballast resistors 712 and 713, Vdd voltage supply rail 705, Vss voltage supply rail 706 and cross power supply clamp 709. All of the above mentioned elements are fabricated in accordance with SOI technology (i.e., SOI devices). Ballast resistors 712 and 713 are optional elements which need not be included in other embodiments of the present invention. Although the Vdd and Vss voltage supply rails are held at different voltages in different circuits, in this embodiment Vdd voltage supply rail 705 is held at 5 volts and Vss rail 706 is grounded during normal operation of circuit 700.

Input pad 701 is connected directly to node 715, which in turn is coupled to Vdd voltage supply rail 705 through ballast resistor 712 and diode 702. Note that the cathode of diode 702 is connected to Vdd voltage supply rail 705. Node 715 is coupled to Vss voltage supply rail 706 through ballast resistor 713 and diode 703, wherein the cathode of diode 703 is connected to node 715. Node 715 is also directly connected to the input terminal of inverter 708 which includes p-channel transistor 721 and n-channel transistor 722. The output terminal of buffer 708 is connected to other SOI circuitry 711 to be protected by circuit 700.

In FIG. 7, cross power supply clamp 709 is shown as an n-channel SOI transistor 716 having a drain D connected to Vdd voltage supply rail 705, and a source S and a gate G connected to Vss voltage supply rail 706. Although shown as a single transistor for illustration purposes, cross power supply clamp 709 typically includes a plurality of parallel transistors. In one embodiment, 20 to 100 parallel n-channel SOI transistors are used to create cross power supply clamp 709. Increasing the number of parallel transistors increases the current carrying capacity of the cross power supply clamp 709. The operation of ESD protection circuit 700 is described below.

When the ESD event involves the application of a positive voltage to input pad 701 relative to Vdd voltage supply rail 705, diode 702 is forward biased and diode 703 is not active because Vss voltage supply rail 706 is floating. As a result, the associated ESD current is discharged to the Vdd voltage supply rail 705 through diode 702 and ballast resistor 712. The voltage drop between input pad 701 and Vdd voltage supply rail 705 is limited by the forward "turn-on" (i.e., threshold) voltage of diode 702 (typically less than 1.0 volt), the forward on-resistance of diode 702 (approximately 1 to 2 ohms), and the resistance of ballast resistor 712 (approximately 2 ohms).

Similarly, when the ESD event involves the application of a negative voltage to input pad 701 relative to Vss voltage supply rail 706, diode 703 is forward biased and diode 702 is not active because Vdd voltage supply rail 705 is floating. The ESD current is discharged to Vss voltage supply rail 706 through diode 703 and resistor 713. The voltage drop between input pad 701 and Vss voltage supply rail 706 is therefore limited by the forward "turn-on" voltage of diode 703 (approximately 0.7 volts), the forward on-resistance of diode 703 (approximately 1 to 2 ohms) and the resistance of ballast resistor 713 (approximately 2 ohms).

When the ESD event involves the application of a voltage to input pad 701 which is negative with respect to Vdd voltage supply rail 705, diode 702 is reversed biased. The reverse breakdown voltage of diode 702 (approximately 50 volts in this embodiment) is typically higher than the voltage at which the gate oxide of transistors 721 and 722 of input buffer 708 and elements within protected circuit 711 will become damaged (hereinafter referred to as the gate oxide breakdown voltage). For purposes of illustration, the gate oxide breakdown voltage is assumed to be approximately 15 volts.

Because the reverse breakdown voltage of diode 702 is greater than the gate oxide breakdown voltage, cross power supply clamp 709 is used to limit the voltage during this ESD event. Because the Vss voltage supply rail 706 is floating, the voltage on Vss voltage supply rail 706 substantially follows the negative voltage applied to input pad 701. A slight voltage difference exists between Vss voltage supply rail 706 and input pad 701 because of the forward "turn-on" voltage and forward on resistance of diode 703 and the resistance of ballast resistor 713. The negative voltage on Vss voltage supply rail 706 causes n-channel SOI transistor 716 to turn off. However, current will flow through transistor 716 when the voltage across the Vdd and Vss voltage supply rails 705 and 706 exceeds the voltage at which transistor 716 begins to operate in breakdown mode (i.e., current flows due to avalanche breakdown). Transistor 716 is typically not damaged by operating in breakdown mode.

The breakdown voltage of transistor 716 is selected to be lower than the gate oxide breakdown voltage (e.g., 15 volts) and greater than the voltage applied across the Vdd and Vss voltage supply rails 705 and 706 during normal operating conditions (e.g., 5 volts). In one embodiment, the breakdown voltage of transistor 716 is approximately 7 volts. Thus, when the voltage across the Vdd and Vss voltage supply rails 705 and 706 exceeds 7 volts, ESD current will flow through transistor 716.

During the above described ESD event (i.e., when a negative voltage with respect to Vdd voltage supply rail 705 is applied to input pad 701), the ESD current is routed through the series combination of cross power supply clamp 709 and forward biased diode 703. Consequently, cross power supply clamp 709 must be able to conduct as much current as diode 703 can conduct in a forward biased condition.

When the ESD event involves the application of a voltage to input pad 701 which is positive with respect to Vss voltage supply rail 706, diode 703 is reversed biased. Because the reverse breakdown voltage of diode 703 (approximately 50 volts in the current embodiment) is higher than the gate oxide breakdown voltage, cross power supply clamp 709 is used to limit the voltage during this ESD event. Because the Vdd voltage supply rail 705 is floating during this ESD event, the voltage on the rail 705 substantially follows the positive voltage applied to input pad 701. A slight voltage difference exists between Vdd voltage supply rail 706 and input pad 701 because of the forward "turn-on" voltage and forward on resistance of diode 702 and the resistance of ballast resistor 712. The negative voltage on Vss voltage supply rail 706 causes n-channel SOI transistor 716 to turn off. However, current will flow through transistor 716 when the voltage across the Vdd and Vss voltage supply rails 705 and 706 exceeds the breakdown voltage of transistor 716 (i.e., 7 volts).

During the above described ESD event (i.e., when a positive voltage with respect to Vss voltage supply rail 706 is applied to input pad 701), the ESD current is routed through the series combination of cross power supply clamp 709 and forward biased diode 702. Consequently, cross power supply clamp 709 must be able to conduct as much current as diode 702 can conduct in a forward biased condition.

Figure 8A:
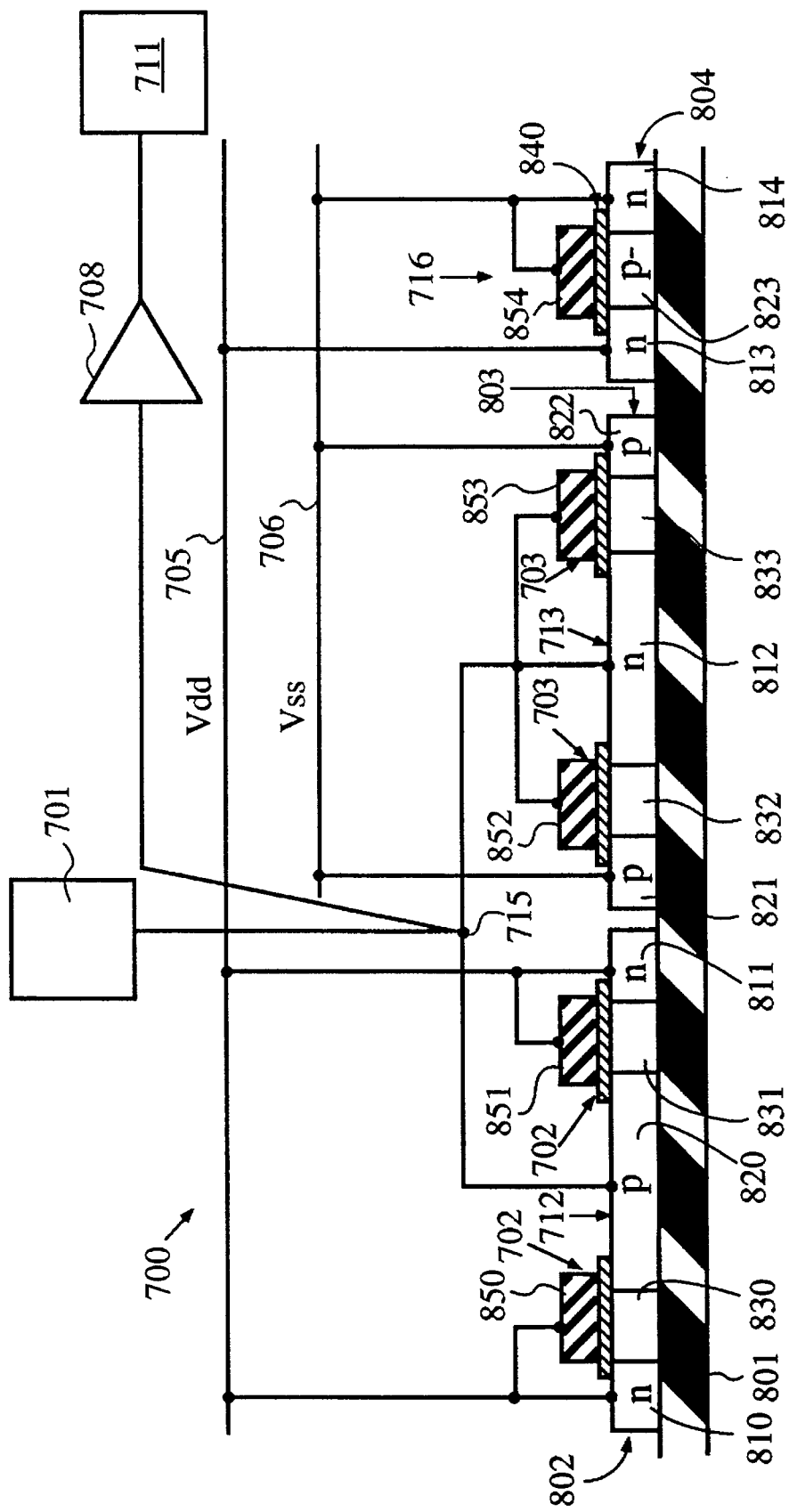
FIG. 8a is a cross sectional and partially schematic diagram illustrating one embodiment of the ESD protection circuit of FIG. 7.

FIG. 8a is a cross sectional and partially schematic diagram illustrating one embodiment of ESD protection circuit 700. The elements of ESD protection circuit 700 are fabricated on insulating layer 801. Insulating layer 801 may be fabricated on a substrate (not shown). Several silicon islands 802–804 are formed on insulating layer 801 using conventional silicon processing techniques. Diode 702 and resistor 712 are fabricated in island 802, diode 703 and resistor 713 are fabricated in island 803 and transistor 716 is fabricated in island 804. It is to be understood that not all elements of FIG. 7 are shown in cross section for simplicity, but all are fabricated using conventional silicon processing techniques.

Gate oxide layer 840 is formed over islands 802–804 and gate electrodes 850–854 are formed over gate oxide layer 840. Silicon islands 802–804 are doped using conventional silicon processing techniques to form n type regions 810–814, p type regions 820–822, p-channel region 823 and center regions 830–833. Center regions 830–833 can be n-type, p type or undoped.

In one embodiment, pad 701 is part of a second level metal layer, and the conductor segment which connects pad 701 to node 715 is part of a first level metal layer. The first and second level metal layers (not shown) are fabricated over the elements illustrated in cross section in FIG. 8a.

N-channel transistor 716, which includes n type regions 813–814, p-region 823 and gate electrode 854, forms the cross power supply clamp 709 (FIG. 7). N type region 813 is connected to Vdd power supply rail 705 (which is conventional and shown here only schematically for simplicity). In one embodiment, Vdd power supply rail 705 can be a part of the second level metal layer. N type region 814 and gate electrode 854 are connected to Vss power supply rail 706 (also shown only schematically). Vss power supply rail 706 can also be part of a second level metal layer. As previously discussed in other embodiments of the present invention, cross power supply clamp 709 (FIG. 7) includes a plurality of parallel connected transistor cells. In one embodiment, the doping of n type regions 813 and 814 is controlled such that region 813 and/or region 814 are electrically resistive, thereby creating ballast resistors on either side of cross power supply clamp 709.

In FIG. 8a, diode 702 is formed by two diodes connected in parallel between node 715 and Vdd voltage supply rail 705. One of these diodes is formed by p type region 820, center region 830, n type region 810 and gate electrode 850. The other diode is formed by p type region 820, center region 831, n type region 811 and gate electrode 851. The doping of p type region 820 is controlled such that region 820 is electrically resistive. As a result, region 820 forms resistor 712 (FIG. 7). Similarly, n type region 812 forms resistor 713 (FIG. 7). In alternate embodiments, n type regions 810 and 811 are doped such that these regions are electrically resistive. This effectively places a ballast resistor between diode 702 and Vdd voltage supply rail 705. Similarly, p type regions 821 and 822 can be doped such that these regions are electrically resistive, thereby forming a ballast resistor between diode 703 and Vss voltage supply rail 706. In yet another variation, the resistances of n type regions 810–814 and p type regions 820–822 are controlled by adjusting the widths of these regions.

While gated diodes 702 and 703 are shown with particular gate connections (FIG. 7), other gate connections are possible. For example, the gate of diode 702 is connectable to either node 715 or to Vss voltage supply rail 706. Similarly, the gate of diode 703 is connectable to Vdd voltage supply rail 705 or to node 715.

Figure 9:
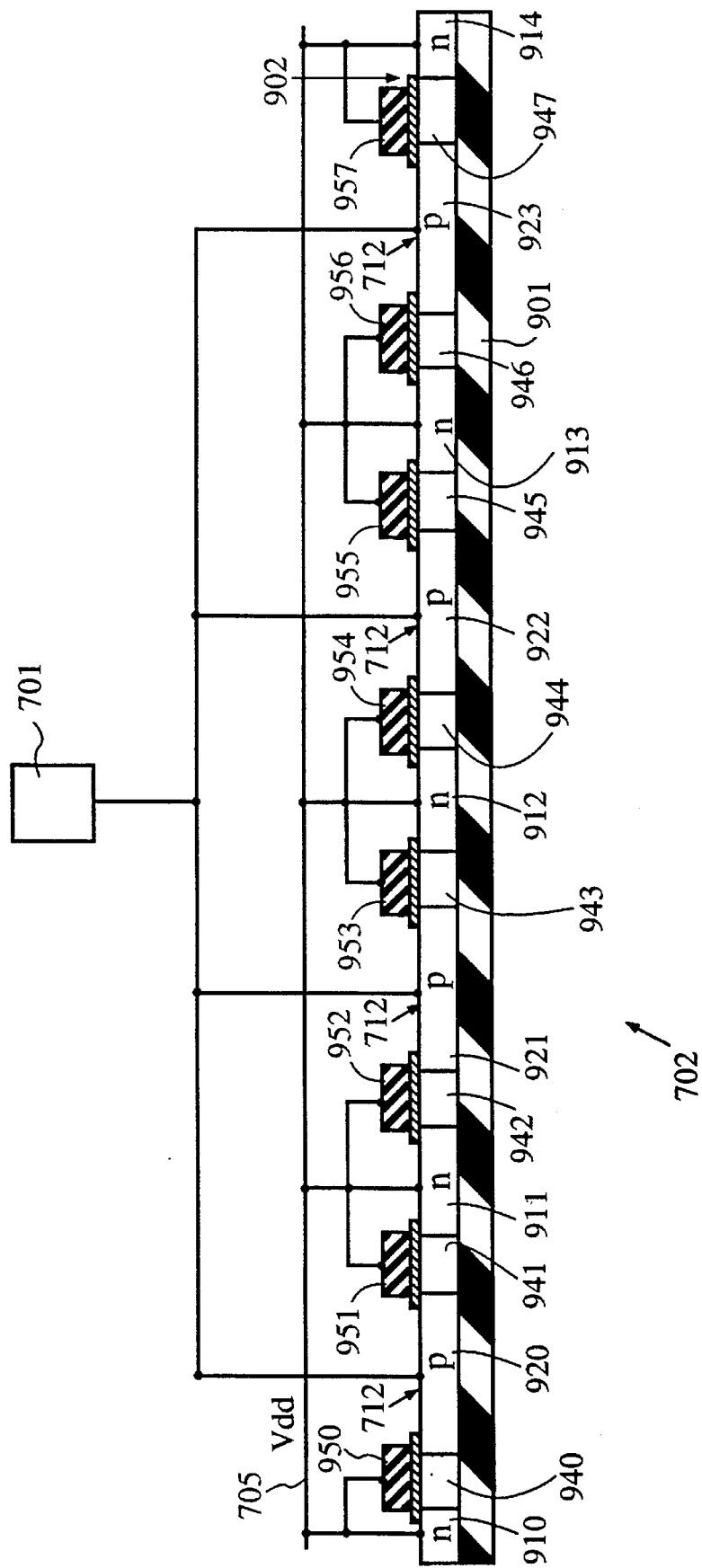
FIG. 9 is a cross sectional and partially schematic diagram illustrating a protection diode formed from eight parallel diodes.

Other embodiments of the invention use different number of diodes. For example, in another embodiment, diode 702 is a single diode. FIG. 9 illustrates an embodiment in which diode 702 includes eight parallel connected diodes. Diode 702 includes insulating layer 901, n type regions 910–914, p type regions 920–923, channel regions 940–947, gate oxide layer 902 and gate electrodes 950–957. N type regions 911–913 are shared between adjacent diodes. Thus, one of the eight parallel connected diodes is formed by p type region 920, channel region 941 and n type region 911, and an adjacent diode is formed by n type region 911, channel region 942 and p type region 921. P type regions 920–923 are connected in parallel between pad 701 and Vdd voltage supply rail 705 (through various other regions) to form resistor 712 (FIG. 7). Diode 703 and resistor 713 in FIG. 7 are fabricated in a manner similar to that illustrated in FIG. 9

Diodes 702 and 703 are larger than diodes conventionally used in SOI ESD protection circuits, which are typically 200 µwide. Additionally, ballast resistors 712 and 713 are smaller (i.e., have a lower resistance) than input resistors typically used in SOI ESD protection circuits (which typically have resistances on the order of 1000 ohms). Moreover, ballast resistors 712 and 713 are not connected in series between input pad 701 and the gates of transistors 721 and 722. In one embodiment, diode 702 and ballast resistor 712 (or diode 703 and ballast resistor 713) are formed from 8 parallel diode/ballast resistor pairs (See, FIG. 9). Each diode/ballast resistor pair is approximately 70 µm wide with a ballast resistance of approximately 16 ohms. As a result, diode 702 (in the embodiment shown in FIG. 9) is an aggregate diode having a width of approximately 560 µm and ballast resistor 712 is an aggregate resistor having a resistance of approximately 2.0 ohms. Other dimensions are possible and within the scope of this invention.

Figure 8B:
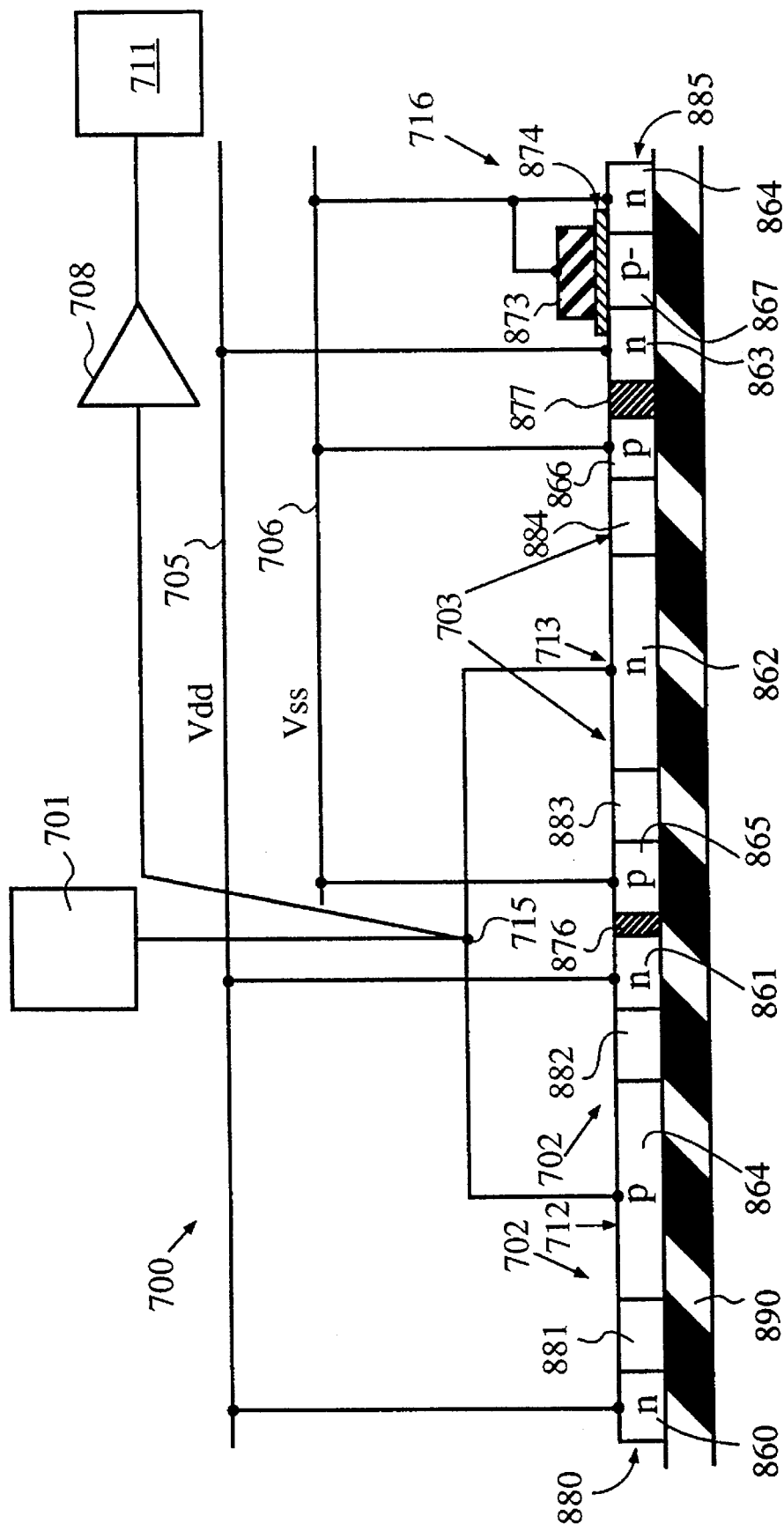
FIG. 8b is a cross sectional and partially schematic diagram illustrating an alternate ESD protection circuit.

Although diodes 702 and 703 are illustrated as gated lateral SOI diodes, in other embodiments these diodes (and all other diodes described in connection with the invention) are non-gated lateral SOI diodes. FIG. 8b illustrates an alternate embodiment of the present invention which utilizes non-gated lateral diodes. Diode 702 and resistor 712 are formed by n type regions 860–861, p type region 864 and center regions 881–882. Diode 703 and resistor 713 are formed by n type region 862, p type regions 865–866 and center regions 883–884. Center regions 881–884 are n-regions, p-regions or undoped regions. N-channel transistor 716 is formed by n type regions 863–864, p-region 867, gate oxide 874 and gate electrode 873. N type regions 860–862 and p type regions 864–866 are formed in a single silicon island 880 which overlies insulating layer 890 (P type region 864 and n type region 862 are joined outside the plane of the cross section illustrated in FIG. 8b). Diodes 702, 703 and 716 are isolated within silicon island 880 by SiO$_2$ regions 876 and 877. N type regions 863–864 and p-region 867 are formed in a separate silicon island 885, which overlies insulating layer 890.

Because the SOI lateral diodes 702 and 703 illustrated in FIG. 8b do not have gate electrodes, these diodes 702 and 703 lack the capacitive coupling introduced by the gate electrodes, and therefore have a low capacitance with respect to the gated lateral diodes 702 and 703 illustrated in FIG. 8a. For this reason, non-gated lateral SOI diodes can be used to provide ESD protection for high frequency device pins, such as those common in radio frequency (RF) communications.

Ballast resistors 712 and 713 dissipate enough power to protect the gate electrodes and channels of diodes 702 and 703 from "hot spot" formation. Hot spot formation can result from physical non-uniformities of diodes 702 and 703. These physical non-uniformities can create non-uniform resistances within diodes 702 and 703 which cause ESD currents to collapse into "filaments" of high current during an ESD event. These high current "filaments" can cause localized portions of diodes 702 and 703 to undergo increased heating, resulting in diode structural failure.

To prevent "hot spot" formation, the values of ballast resistors 712 and 713 are selected to have the minimum resistance required to provide an even current distribution within diodes 702 and 703, without compromising the low forward on-resistances of diodes 702 and 703. The foregoing discussion of "hot spot" formation and ballast resistors 712 and 713 is applicable to both gated and non-gated lateral diodes, as well as embodiments of cross power supply clamp 709 which include ballast resistors. Ballast resistors can also be included in an output buffer in accordance with the present invention to avoid "hot spot" formation.

Figure 1:
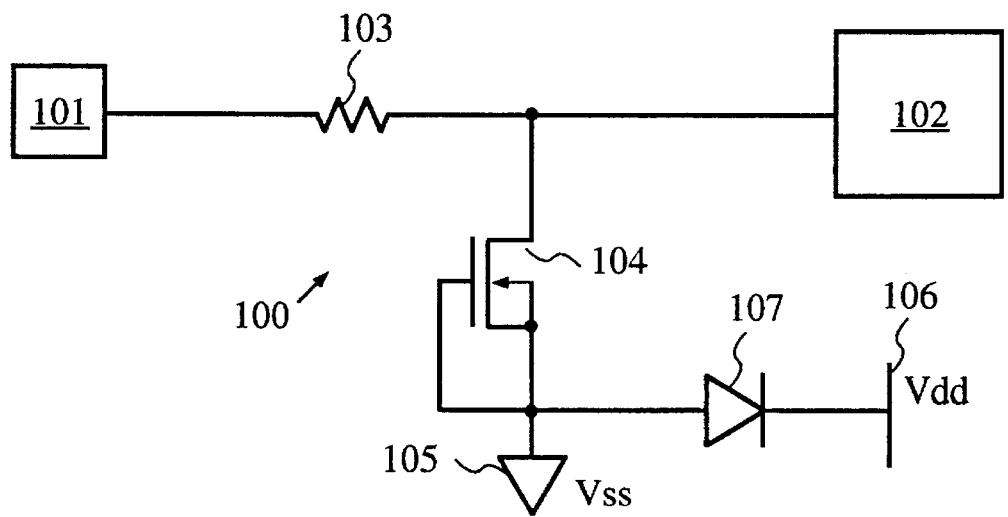
FIG. 1 is a schematic diagram of a conventional ESD protection circuit.
Figure 2:
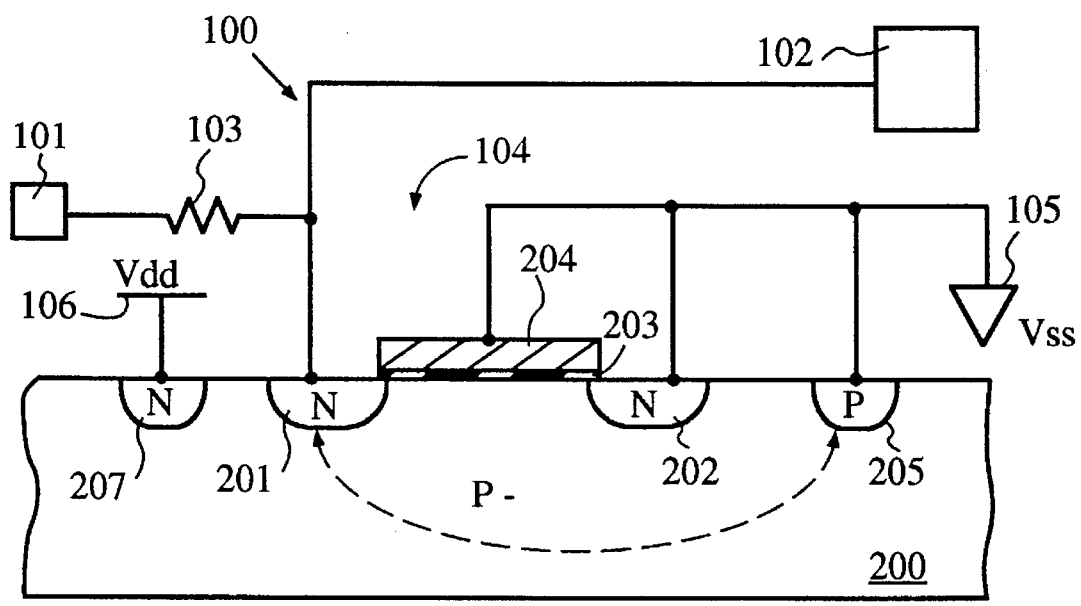
FIG. 2 is a cross sectional view of the ESD protection circuit of FIG. 1.
Figure 3:
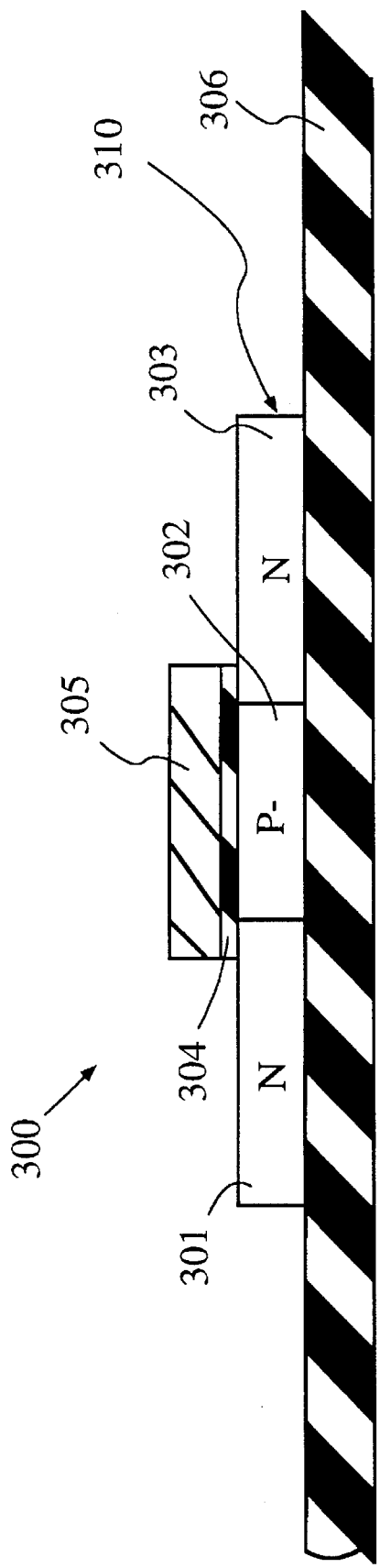
FIG. 3 is a cross sectional diagram of a conventional n-channel SOI transistor.
Figure 4:
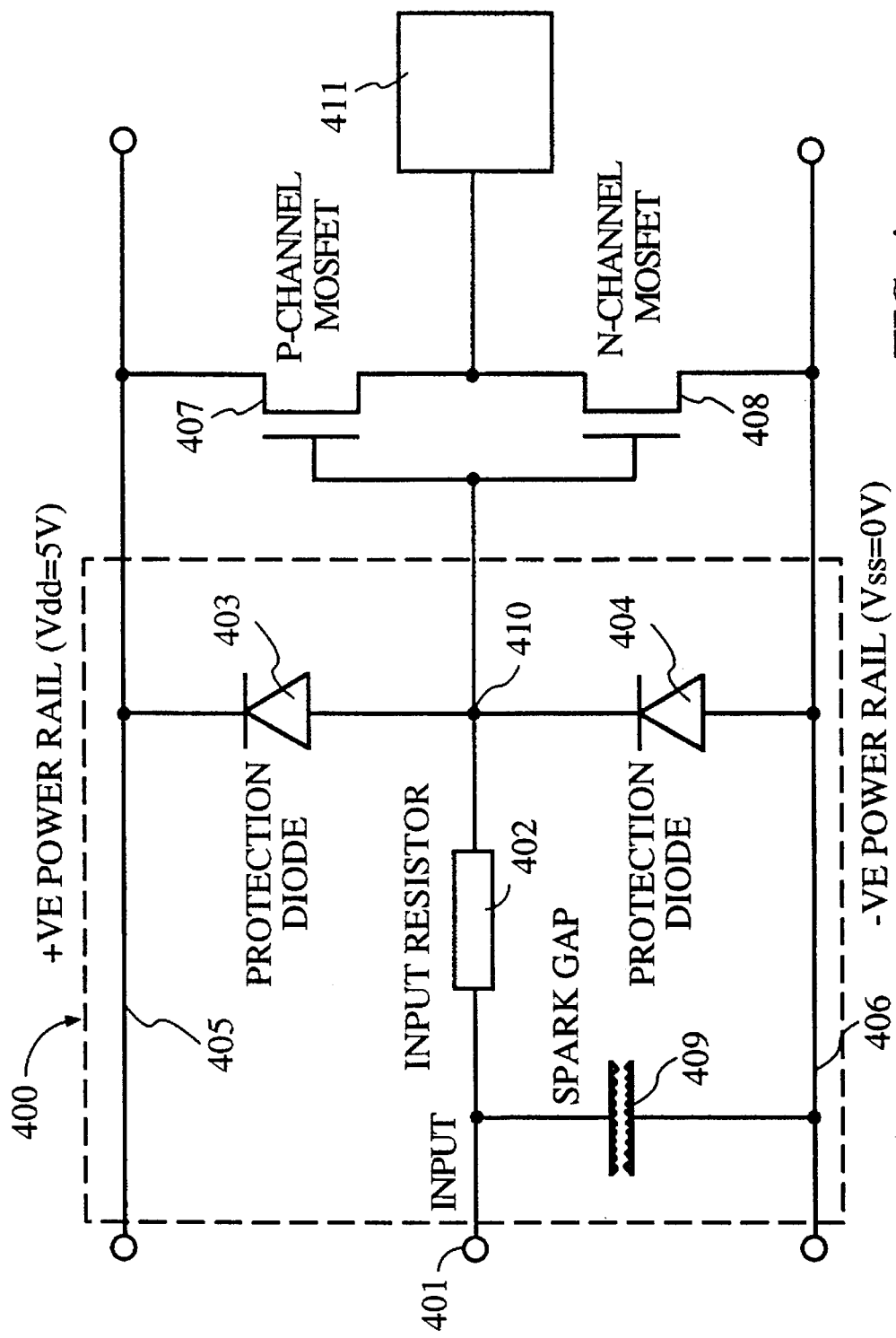
FIG. 4 is a schematic diagram of a conventional SOI ESD protection circuit.
Figure 5:
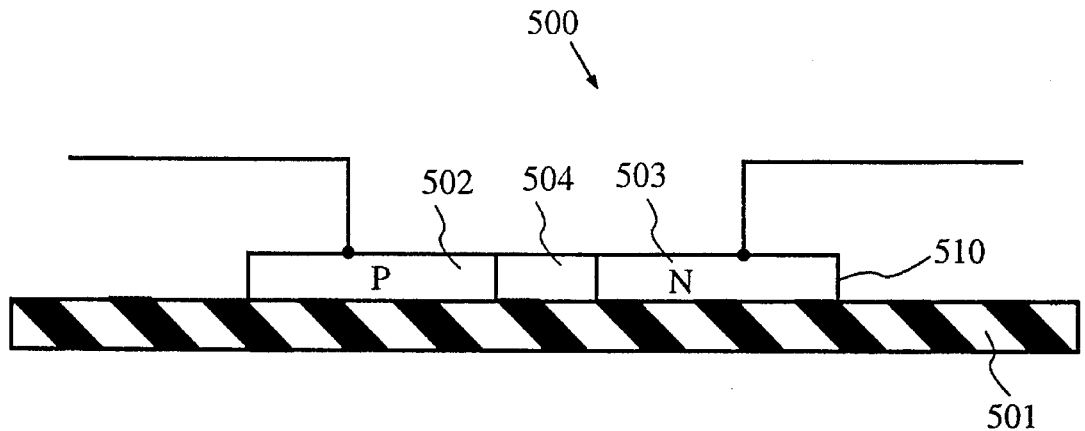
FIGS. 5 and 6 are cross sectional diagrams of conventional SOI lateral diodes.
Figure 6:
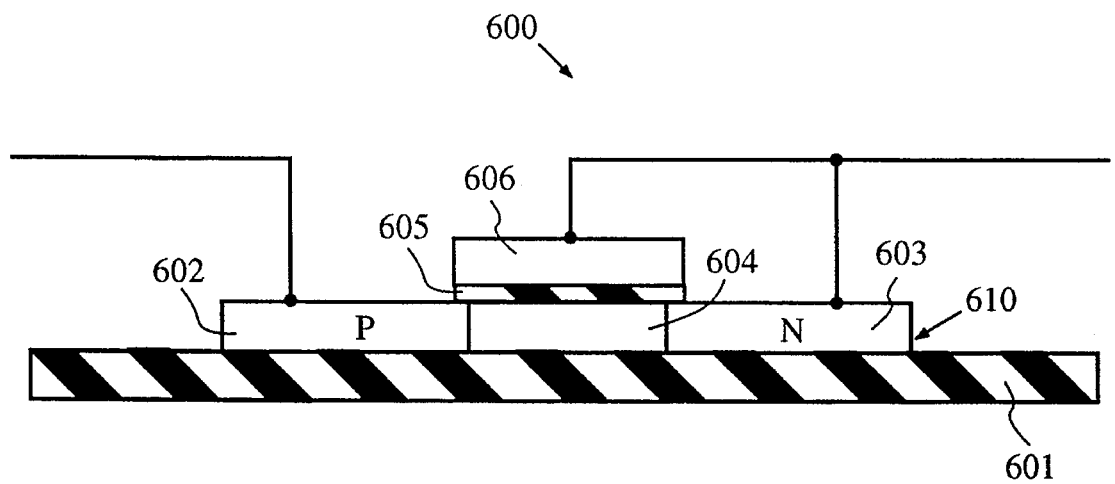

Ballast resistors 712 and 713 are not connected in series with the signal path from input pad 701 to protected circuit 711. Consequently, ballast resistors 12 and 713 introduce no RC delay to signals transmitted between input pad 701 and circuit 711 (when compared to input resistor 402 in FIG. 4).

The present invention eliminates high-resistance input resistor 402 (FIG. 4) of prior art ESD protection circuits, thereby eliminating a common point of failure in prior art ESD protection circuits.

Figure 10A:
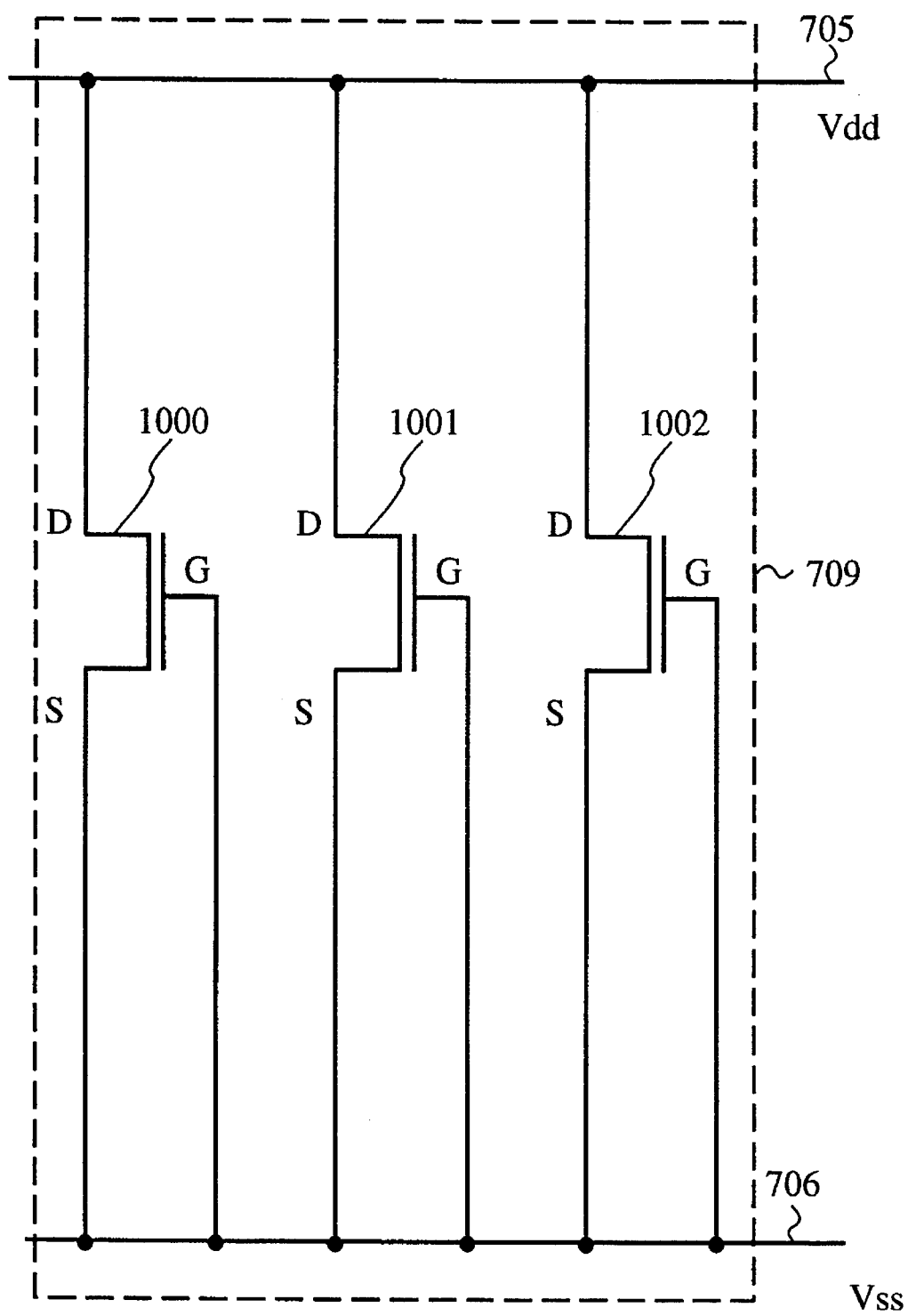

FIG. 10a illustrates one embodiment of cross power supply clamp 709 which includes a plurality of n-channel transistors 1000–1002 connected in parallel between Vdd voltage supply rail 705 and Vss voltage supply rail 706. Transistors 1000–1002 are selected such that their breakdown voltage conforms with the guidelines set forth above for cross power supply clamp 709, i.e., the breakdown voltage of transistors 1000–1002 is less than the reverse breakdown voltages of diodes 702 and 703, less than the gate oxide breakdown voltage, and greater than the voltage applied across rails 705 and 706 during normal operating conditions. In one embodiment, the breakdown voltage of transistors 1000–1002 is approximately 7 volts. Thus, when the voltage across the Vdd and Vss voltage supply rails 705 and 706 exceeds 7 volts (with the voltage on Vdd voltage supply rail 705 positive with respect to the voltage on Vss voltage supply rail 706), transistors 1000–1002 break down and ESD current will flow through these transistors.

The threshold voltages of transistors 1000–1002 are selected such that transistors 1000–1002 will turn on to conduct ESD current when the voltage on Vss voltage supply rail 706 exceeds the voltage on Vdd voltage supply rail 705 by the threshold voltage of transistors 1000–1002 (typically 0.7 volts). Although three transistors are illustrated in FIG. 10a, other numbers of transistors are used in other embodiments.

Figure 10C:
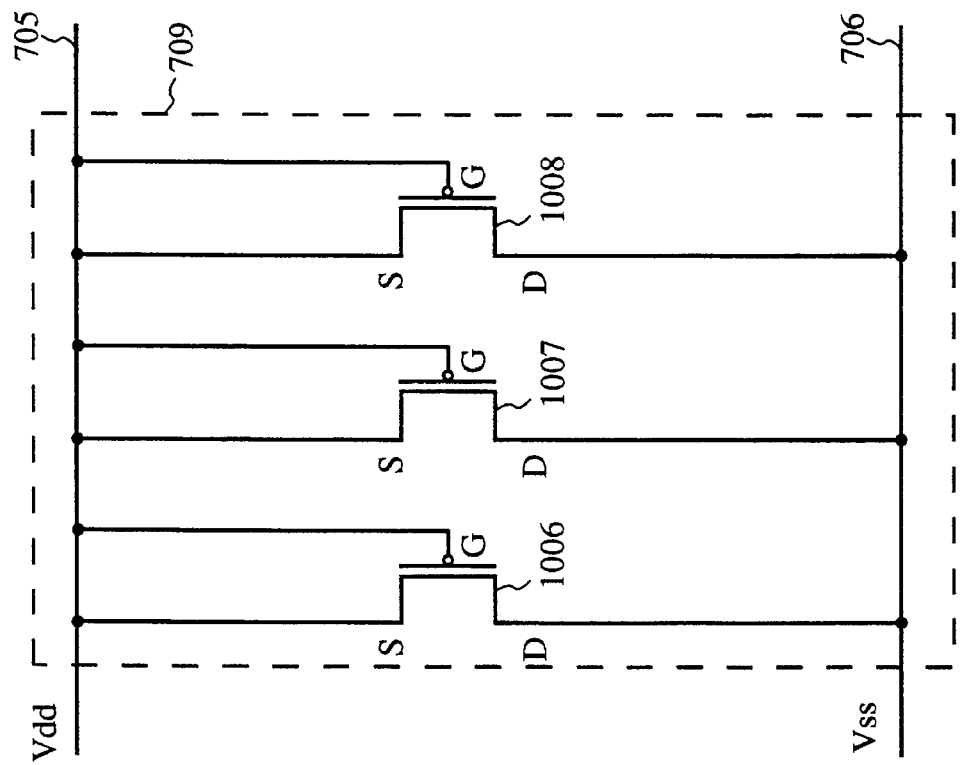
Figure 10B:
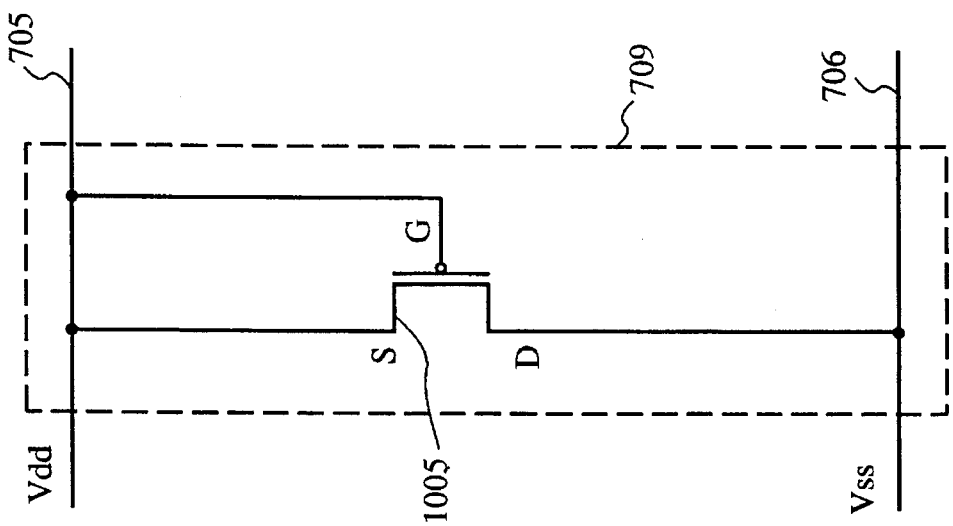

The embodiments of cross power supply clamp 709 described above in connection with FIGS. 7 and 10a can alternatively be implemented with p-channel transistors. Thus, as illustrated in FIGS. 10b and 10c, cross power supply clamp 709 can include a p-channel transistor 1005 (FIG. 10b), or a plurality of parallel p-channel transistors 1006–1008 (FIG. 10c), respectively. Each transistor 1005–1008 has a gate G and a source S connected to Vdd voltage supply rail 705 and a drain D connected to Vss voltage supply rail 706. The breakdown voltages of transistor 1005 and parallel transistors 1006–1008 conform with the guidelines previously set forth for cross power supply clamp 709.

FIG. 10d is a schematic diagram of another embodiment of cross power supply clamp 709. Diode 1009, which is connected between Vdd and Vss voltage supply rails 705 and 706, has a reverse breakdown voltage which conforms to the guidelines previously set forth for cross power supply clamp 709. To achieve such a reverse breakdown voltage, diode 1009 has a different channel length, different doping profiles and/or different dopant species than primary diodes 702 and 703. Diode 1009 is either a gated diode or nongated lateral diode.

FIG. 10e illustrates another embodiment in which a plurality of zener diodes 1010–1014 are connected in series between Vdd voltage supply rail 705 and Vss voltage supply rail 706 to form cross power supply clamp 709. The reverse breakdown voltage of zener diodes 1010–1014 conforms with the guidelines previously set forth for cross power supply clamp 709. However, note that this embodiment has some associated area penalty.

FIGS. 10f–10j illustrate alternate embodiments of cross power supply clamp 709. Each of the cross power supply clamps 709 illustrated in FIGS. 10f–10j include a first element (or elements) which conduct ESD current from Vdd voltage supply rail 705 to Vss voltage supply rail 706 when the voltage on Vdd voltage supply rail 705 exceeds the voltage on Vss voltage supply rail 706 by a predetermined voltage which is greater than the voltage difference between rails 705 and 706 during normal operating conditions, but less than the gate oxide breakdown voltage. In the embodiments illustrated in FIGS. 10f–10j, this predetermined voltage is assumed to approximately 7 volts, although other voltages are possible.

The cross power supply clamps 709 illustrated in FIGS. 10f–10j also include a second element 1099 which conducts current from Vss voltage supply rail 706 to Vdd voltage supply rail 705 when the voltage on rail 706 exceeds the voltage on rail 705. This second element 1099 can include any of the devices previously described in connection with FIGS. 7 and 10a–10e. For example, the second element 1099 can include diode 1009 as illustrated in FIG. 10d.

Figure 10F:
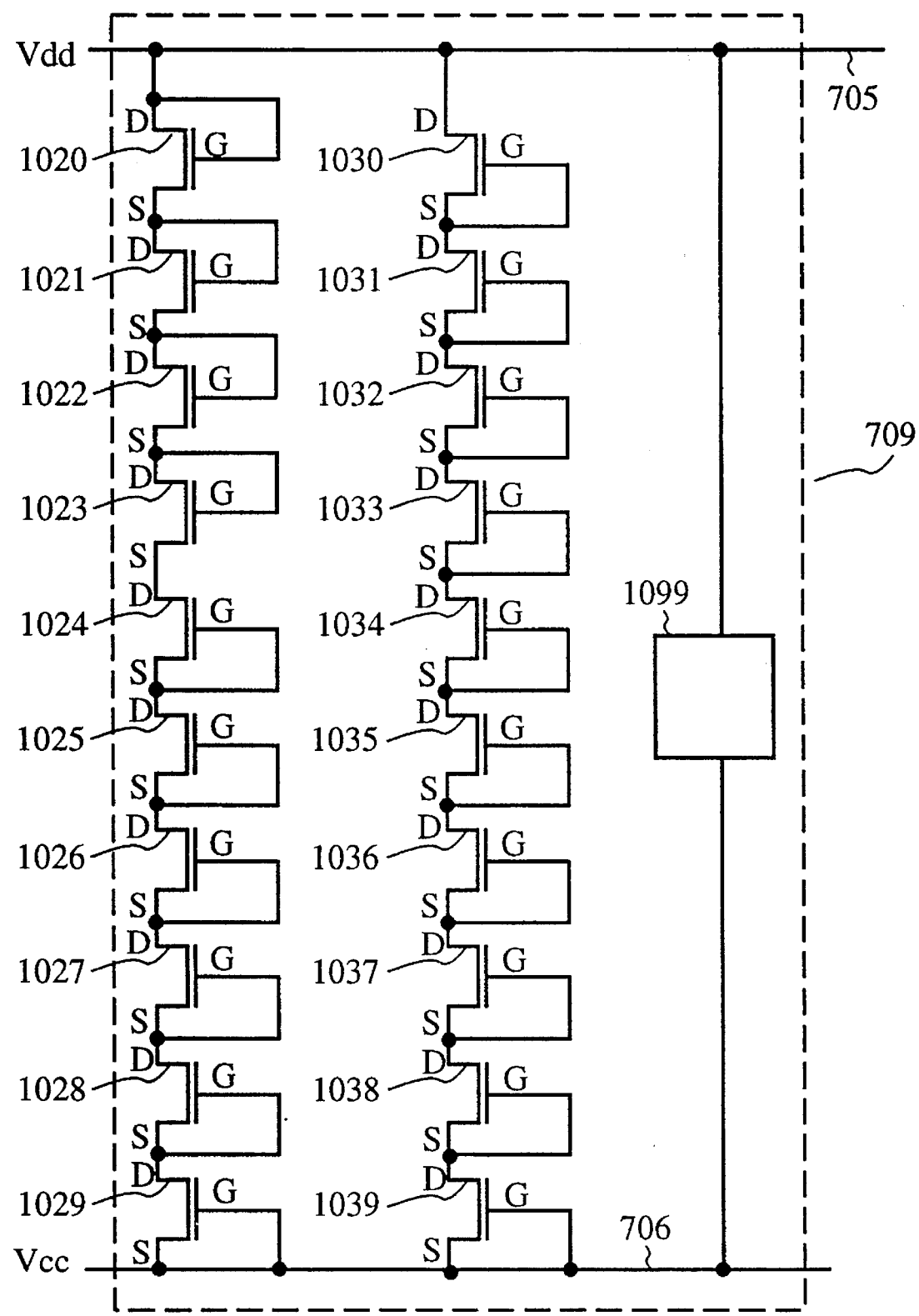

In FIG. 10f, cross power supply clamp 709 includes a first plurality of series connected n-channel transistors 1020–1029 and a second plurality of series connected n-channel transistors 1030–1039, each connected between Vdd voltage supply rail 705 and Vss voltage supply rail 706. The gate electrode of each of transistors 1020–1039 is connected to its corresponding drain. In the embodiment illustrated, each of transistors 1020–1039 has a threshold voltage of approximately 0.7 volts. Thus, when the voltage on Vdd voltage supply rail 705 exceeds the voltage on Vss voltage supply rail 706 by 7 volts (i.e., the predetermined voltage), transistors 1020–1039 turn on to conduct current between these voltage supply rails 705–706. In other embodiments, other numbers of transistors and other transistor threshold voltages are possible. Additionally, other numbers of parallel paths (e.g., one, three, four, etc.) can be formed between rails 705 and 706.

Figure 10G:
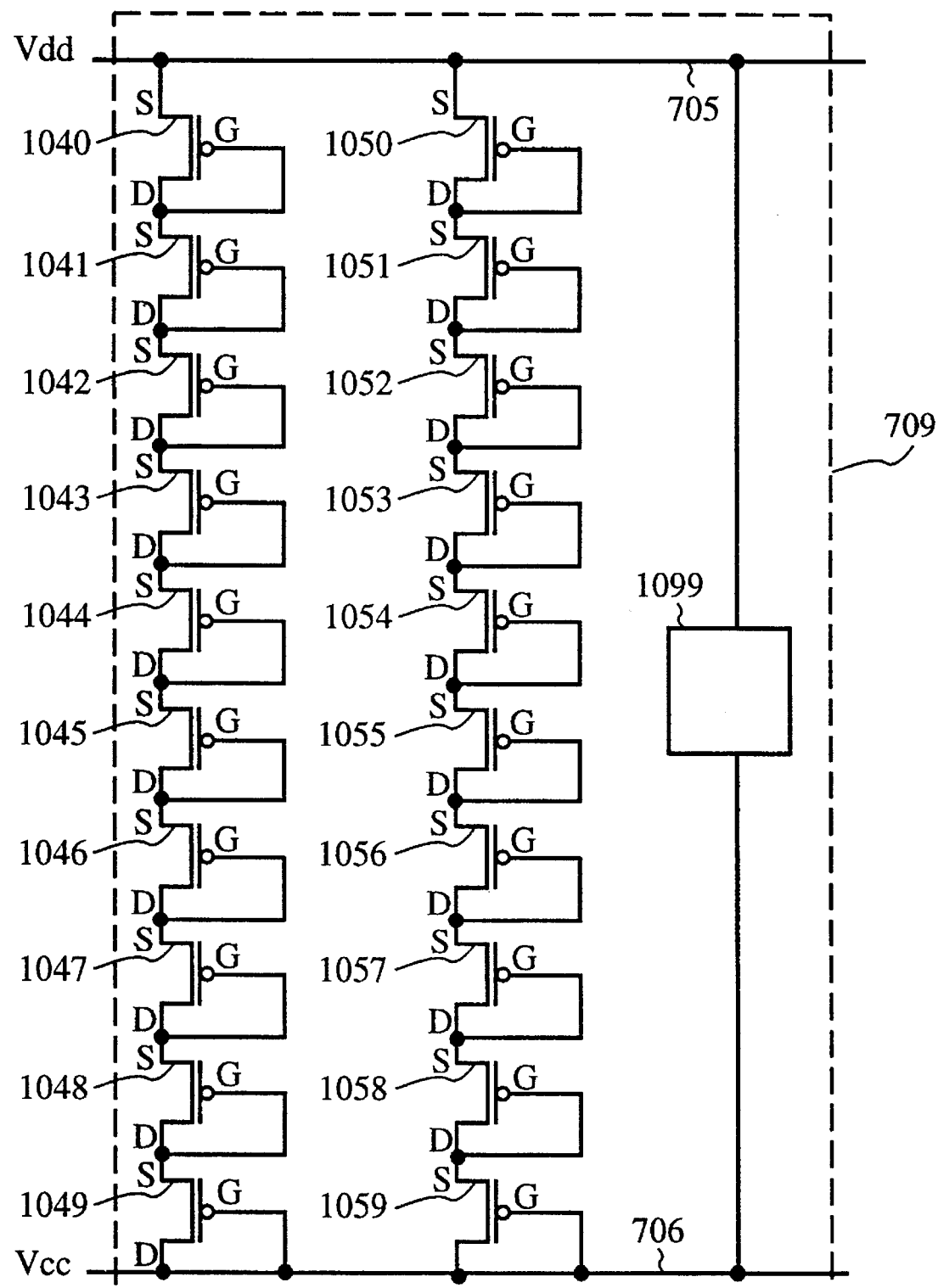

FIG. 10g illustrates an embodiment in which cross power supply clamp 709 includes a first plurality of series connected p-channel transistors 1040–1049 and a second plurality of series connected p-channel transistors 1050–1059, each connected between Vdd voltage supply rail 705 and Vss voltage supply rail 706. The gate electrode of each of p-channel transistors 1040–1059 is connected to its corresponding drain. The cross power supply clamp 709 illustrated in FIG. 10g operates in a manner similar to the cross power supply clamp 709 of FIG. 10f. Again, in other embodiments, other numbers of transistors, other transistor threshold voltages and other numbers of parallel paths are possible.

Figure 10H:
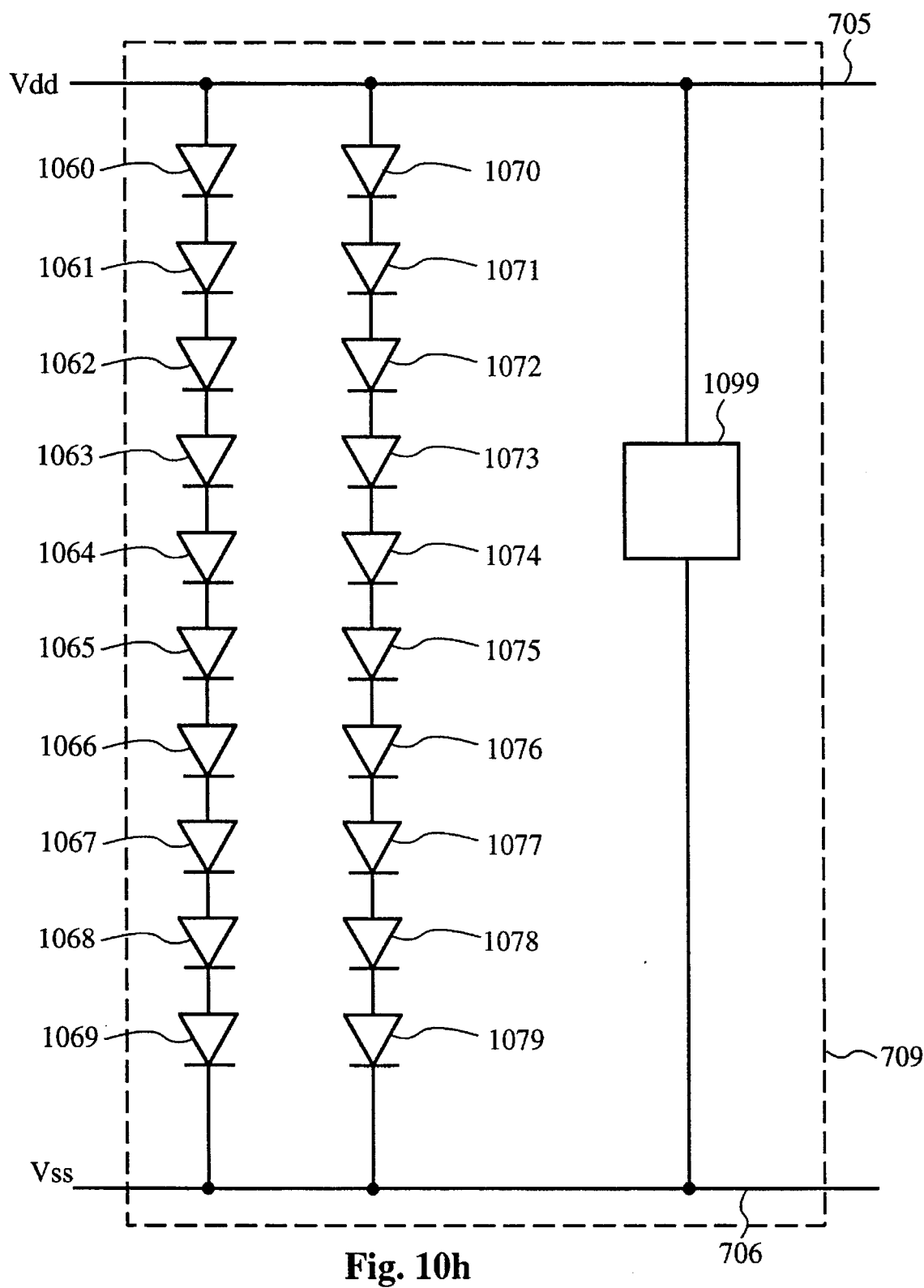

FIG. 10h illustrates an alternate embodiment in which a first plurality of series connected diodes 1060–1069 and a second plurality of series connected diodes 1070–1079 are connected in parallel between rails 705 and 706 to form cross power supply clamp 709. Each of diodes 1060–1079 has a forward turn on voltage of approximately 0.7 volts. Thus, diodes 1060–1079 turn on to conduct from Vdd voltage supply rail 705 to Vss voltage supply rail 706 when the voltage on rail 705 is more than seven volts greater than the voltage on rail 706. Other numbers of series connected diodes and other numbers of parallel diode paths are possible and within the intended scope of the invention.

Figure 10J:
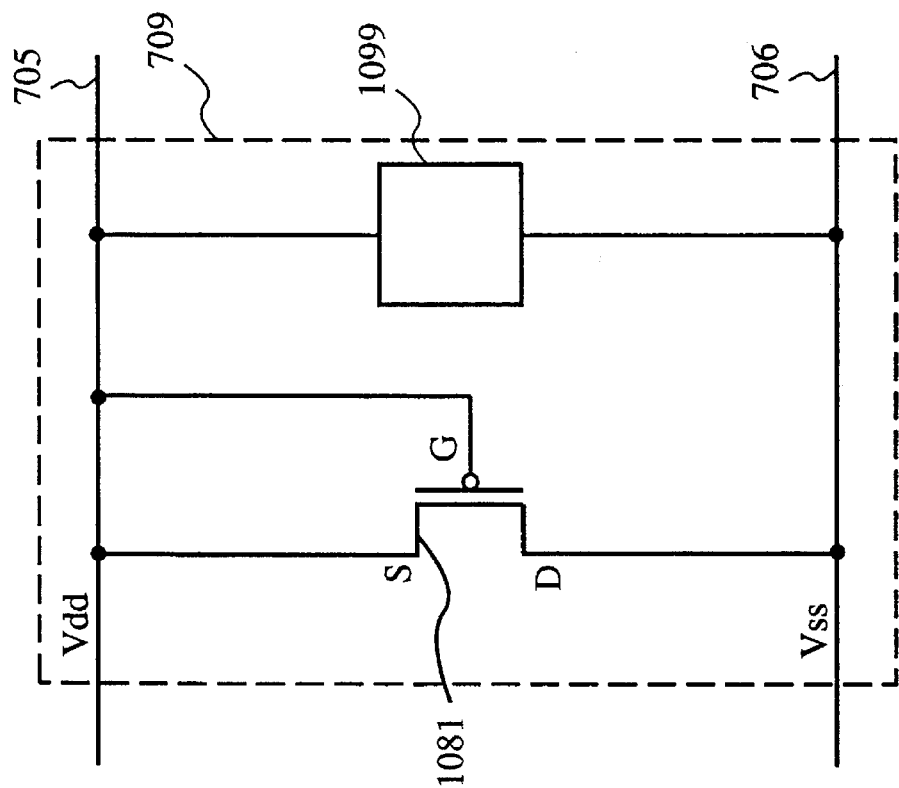
Figure 10I:
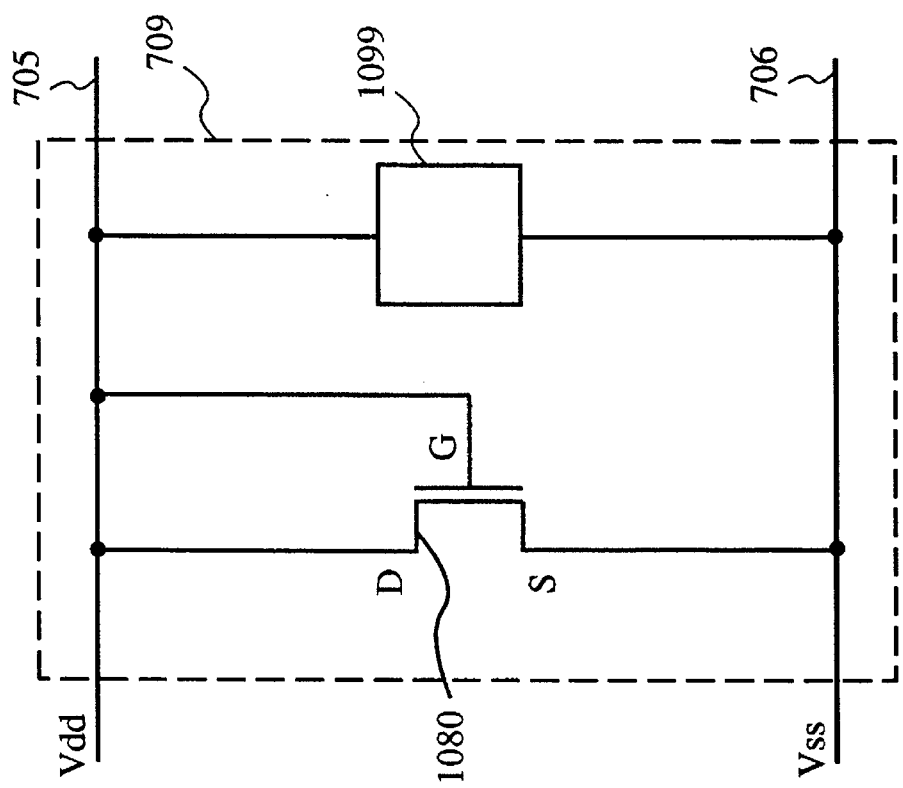

In FIG. 10i, cross power supply clamp 709 includes n-channel transistor 1080 and second element 1099. Transistor 1080 has a threshold voltage greater than the voltage normally applied across the Vdd and Vss voltage supply rails 705, 706. In the embodiment illustrated, the threshold voltage of transistor 1080 is approximately 7 volts. Thus, n-channel transistor 1080 conducts forward from the Vdd voltage supply rail 705 to the Vss voltage supply rail 706 when the voltage on Vdd voltage supply rail 705 exceeds the voltage on Vss voltage supply rail 706 by 7 volts.

FIG. 10j illustrates an alternate embodiment of the cross power supply clamp 709 shown in FIG. 10i. In this embodiment, cross power supply clamp 709 includes p-channel transistor 1081 and second element 1099. Transistor 1081 has a threshold voltage greater than the voltage normally applied across the Vdd and Vss voltage supply rails 705, 706. Thus, if p-channel transistor 1081 has a threshold voltage of 7 volts, transistor 1081 conducts forward from Vdd voltage supply rail 705 to Vss voltage supply rail 706 when the voltage on Vdd voltage supply rail 705 exceeds the voltage on Vss voltage supply rail 706 by 7 volts.

In a variation of the above-described embodiments, the breakdown voltages of the cross power supply clamp 709 and diodes 702 and 703 can be selected such that ESD current is routed through cross power supply clamp 709 and one of diodes 702 and 703 conducting in the reverse breakdown state.

Figure 11:
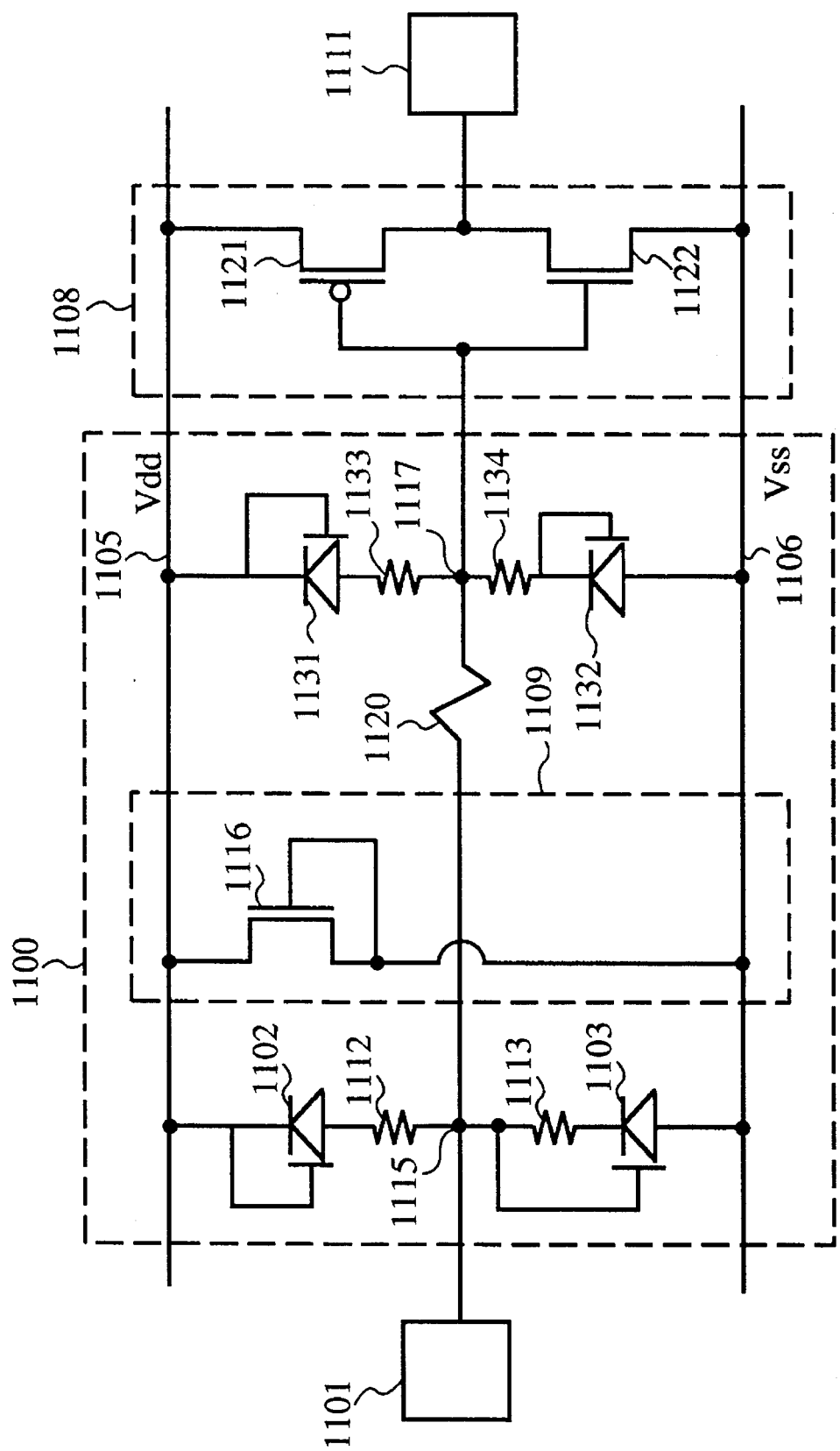
FIG. 11 is a schematic diagram of an SOI ESD protection circuit in accordance with an alternate embodiment of the invention.

FIG. 11 illustrates an ESD protection circuit 1100 in accordance with an alternate embodiment of the invention. ESD protection circuit 1100 includes input pad 1101, primary diodes 1102 and 1103, diode anode ballast resistors 1112 and 1113, Vdd voltage supply rail 1105, Vss voltage supply rail 1106, cross power supply clamp 1109, input resistor 1120, secondary diodes 1131 and 1132 and secondary ballast resistors 1133 and 1134. Ballast resistors 1112, 1113, 1133 and 1134 are optional elements which need not be included in other embodiments of the present invention.

Input pad 1101, primary diodes 1102–1103, ballast resistors 1112–1113 and cross power supply clamp 1109 are fabricated and connected in a manner similar to the corresponding elements previously described in connection with ESD protection circuit 700 (FIGS. 7, 8a and 8b). Although cross power supply clamp 1109 is illustrated as an n-channel SOI transistor 1116 connected between Vdd voltage supply rail 1105 and Vss voltage supply rail 1106, clamp 1109 can also be configured as described in FIGS. 10a–10j.

In addition, node 1115 is connected to node 1117 through input resistor 1120. Node 1117 is coupled to Vdd voltage supply rail 1105 through ballast resistor 1133 and secondary diode 1131, to Vss voltage supply rail 1106 through ballast resistor 1134 and diode 1132, and to an input terminal of input buffer 1108. The output terminal of input buffer 1108 is connected to SOI circuitry 1111.

Input resistor 1120 and secondary diodes 1131–1132 further clamp the voltages provided to input buffer 1108 during an ESD event. Input resistor 1120, and the voltage drop across resistor 1120, defines the current carrying requirements of the secondary diodes 1131 and 1132. The resistance of input resistor 1120 and the sizes of diodes 1102, 1103, 1131 and 1132 are selected such that the current densities in secondary diodes 1131 and 1132 are less than the current densities in primary diodes 1102 and 1103. As a result, the voltages across secondary diodes 1131 and 1132 are less than the voltages across primary diodes 1102 and 1103.

In one embodiment, the resistance of input resistor 1120 is 150 ohms and primary diodes 1102–1103 and ballast resistors 1112–1113 are formed from eight parallel diode/ballast resistor pairs as previously described in connection with FIG. 9. Secondary diode 1131 and ballast resistor 1133 (or secondary diode 1132 and ballast resistor 1134) are formed from a single parallel diode/ballast resistor pair. Each secondary diode/ballast resistor pair is approximately 70 μm wide with a ballast resistance of approximately 16 ohms and a forward on resistance of approximately 16 ohms. Other dimensions of diodes 1102, 1103, 1131 and 1132 and ballast resistors 1112, 1113, 1133 and 1134 are possible and within the scope of this invention. Similarly, other values of input resistor 1120 are possible and within the scope of this invention.

In the above described embodiment, the current which flows through primary diode 1102 (or 1103) is approximately 45 times greater than the current which flows through secondary diode 1131 (or 1132). Because primary diodes 1102 and 1103 are eight times wider than secondary diodes 1131 and 1132, the current densities in primary diodes 1102 and 1103 are approximately 5.6 times larger than the current densities in secondary diodes 1131 and 1132. The voltage drops across secondary diodes 1131 and 1132 and ballast resistors 1133 and 1134 are approximately 5.6 times less than the voltage drops across primary diodes 1102 and 1103 and ballast resistors 1112 and 1113.

Because input resistor 1120 has a smaller resistance than prior art input resistors (which typically have values of 1000 ohms) and because secondary diodes 1131 and 1132 have relatively small capacitances, the RC delay introduced by input resistor 1120 is smaller than the RC delay experienced in prior art ESD protection circuits.

In accordance with another aspect of the invention, primary diodes 1102–1103, secondary diodes 1131–1132, ballast resistors 1112–1113 and 1133–1134, and cross power supply clamp 1109 are fabricated on one or more silicon "islands." Because silicon is a better thermal conductor than the underlying insulator (e.g., sapphire or $SiO_2$), heat is spread within the silicon islands, thereby promoting heat dissipation. In one embodiment, primary diode 1102, secondary diode 1131 and ballast resistors 1112 and 1133 are fabricated in a one silicon island, primary diode 1103, secondary diode 1132 and ballast resistors 1113 and 1134 are fabricated in another silicon island, and the devices which make up cross power supply clamp 1109 can be fabricated on a plurality of separate silicon islands or on a single silicon island.

In another embodiment, primary diodes 1102–1103 secondary diodes 1131–1132 and ballast resistors 1112–1113 and 1133–1134 are fabricated in a single silicon island, and the elements which make up the cross power supply clamp 1109 are fabricated on a plurality of separate silicon islands or a single silicon island. Note that this technique is opposite to the techniques traditionally used in bulk MOS circuits, in which ESD elements are intentionally separated to avoid latch-up and unwanted parasitic current paths.

Figure 12:
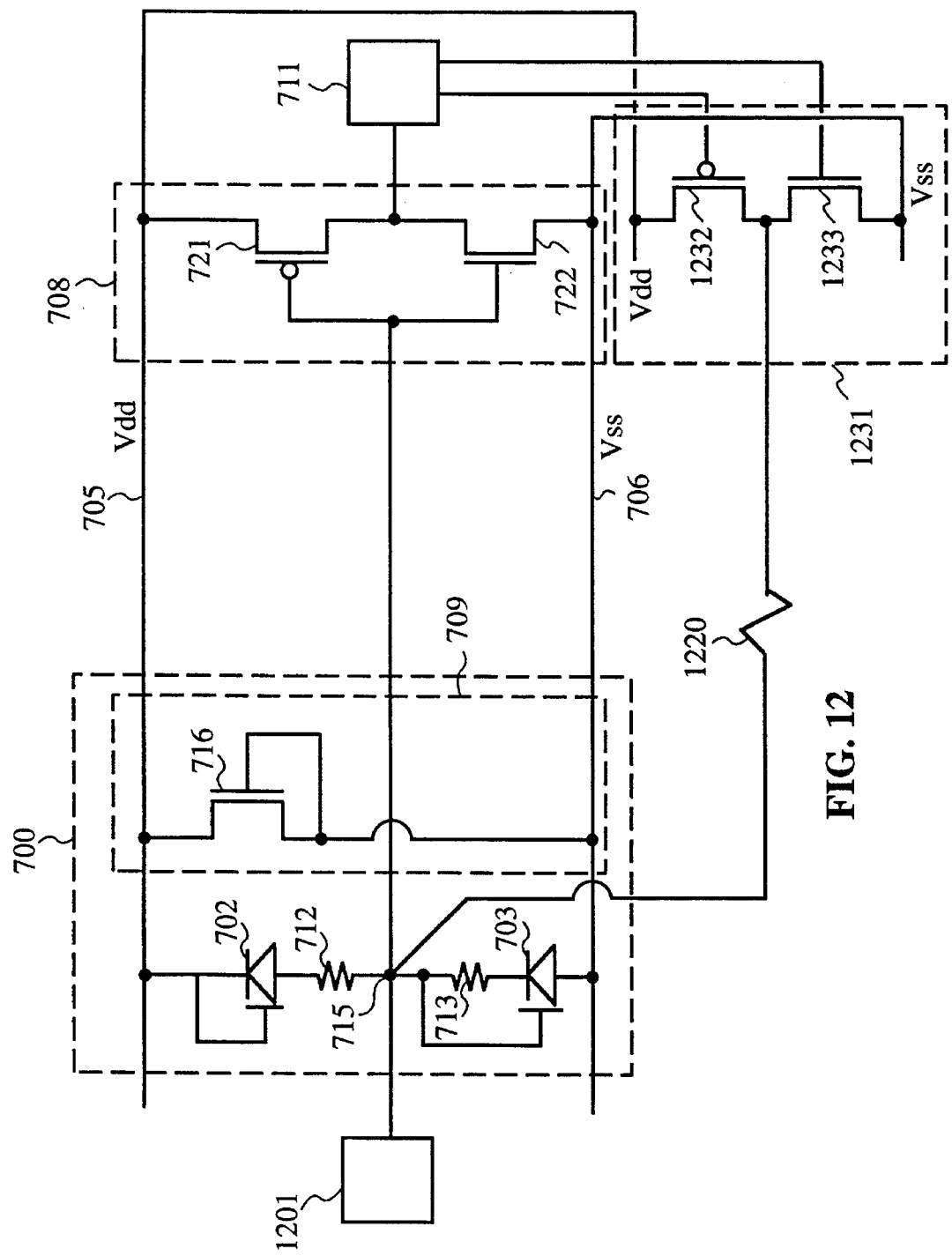
FIGS. 12 and 13 are schematic diagrams of SOI ESD protection circuits for I/O pins in accordance with alternate embodiments of the invention.

ESD protection circuits 700 (FIG. 7) and 1100 (FIG. 11) are also used to provide ESD protection for output pads and input/output (I/O) pads. FIG. 12 illustrates how ESD protection circuit 700 can be modified to provide ESD protection for output buffer 1231 (in addition to input buffer 708). The input terminals of output buffer 1231 are connected to circuit 711. The output terminal of output buffer 1231 is connected to node 715 through output resistor 1220. Output resistor 1220 is an optional element which need not be included in other embodiments of the present invention. Output buffer 1231 typically includes p-channel transistor 1232 and n-channel transistor 1233. Because transistors 1232 and 1233 are SOI devices, output buffer 1231 does not include parasitic P/N junctions (which would help to dissipate power during an ESD event). However, ESD protection circuit 700 operates as previously described to provide ESD protection to input buffer 708 and output buffer 1231. Output resistor 1220, which typically has a resistance of 10 ohms (in aggregate), further limits current flow to output buffer 1231 during ESD events. Protection circuit 700 would also protect output buffer 1231 in the absence of input buffer 708 (i.e., if pad 1201 were an output pad).

Figure 13:
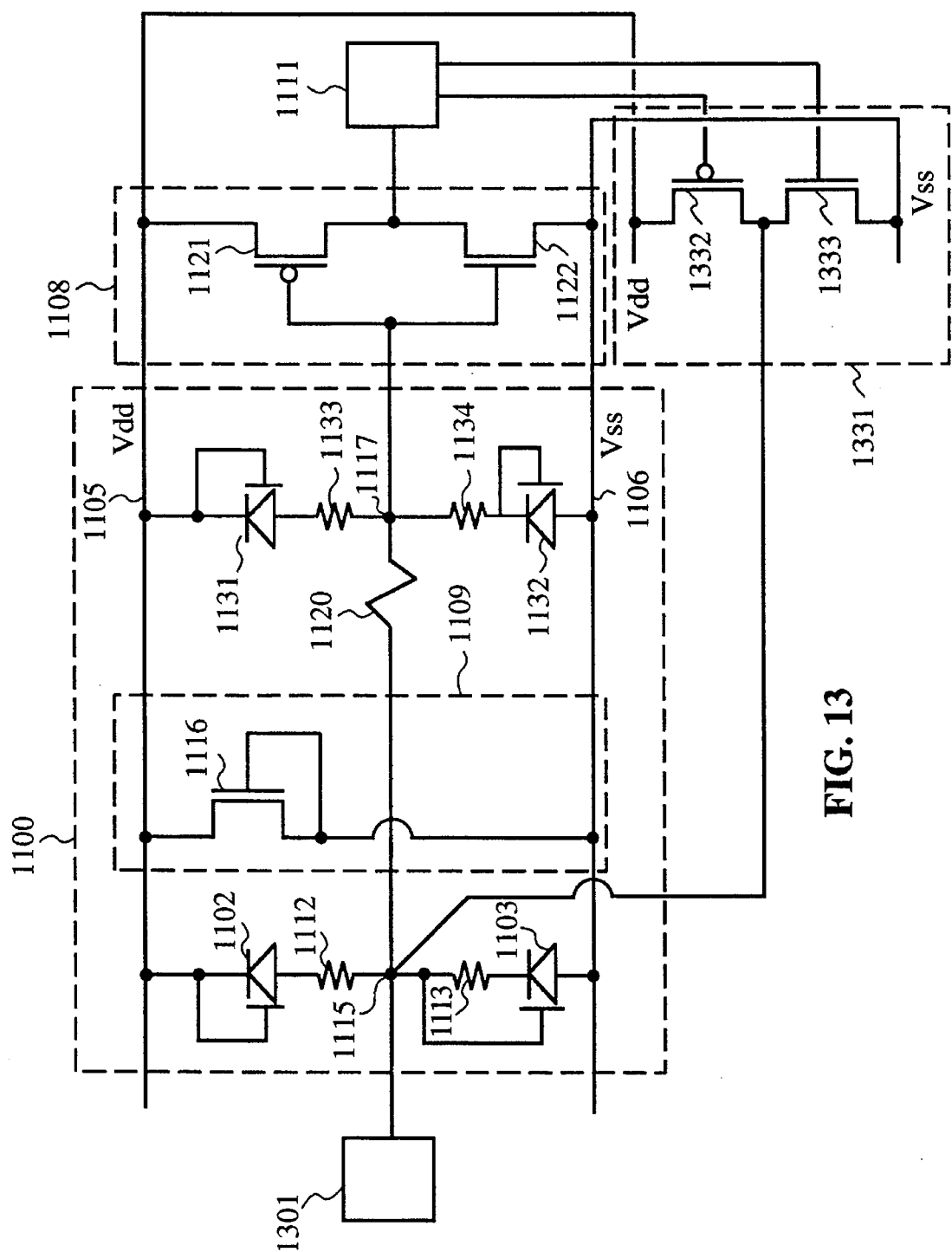

FIG. 13 illustrates an ESD protection circuit 1100 used to protect output buffer 1331 of an I/O circuit. The input terminal of output buffer 1331 is connected to circuit 1111. The output terminal of output buffer 1331 is connected directly to node 1115. In other embodiments, the output terminal of output buffer 1131 is connected to node 1115 through an output resistor similar to output resistor 1220 (FIG. 12). Output buffer 1331 includes p-channel transistor 1332 and n-channel transistor 1333. ESD protection circuit 1100 operates substantially as previously described in connection with FIG. 11 to provide ESD protection to input buffer 1108 and output buffer 1331. In another embodiment, an output resistor (not shown) can be connected between the output terminal of output buffer 1131 and node 1115 to further limit current flow to output buffer 1331 during ESD events.

Output buffers 1231 (FIG. 12) and 1331 (FIG. 13) are typically fabricated on the same silicon islands as the primary diodes, secondary diodes and/or cross power supply clamp. In one embodiment, primary diode 1102, ballast resistor 1112, secondary diode 1131, ballast resistor 1133 and transistor 1332 (of output buffer 1331) are fabricated on one silicon island and primary diode 1103, ballast resistor 1113, secondary diode 1132, ballast resistor 1134 and transistor 1333 (of output buffer 1331) are fabricated on another silicon island. Cross power supply clamp 1109 can fabricated on either or both of the silicon islands.

ESD protection circuits in accordance with the present invention have demonstrated repeatable human body model (HBM) ESD protection in excess of 6000 volts on the SOI circuitry described in U.S. patent application Ser. No. 08/090,400, entitled "Minimum Charge FET Fabricated on an Ultrathin Silicon on Sapphire Wafer", filed Jul. 12, 1993 by Burgener and Reedy, herein incorporated by reference in its entirety. In particular embodiments of the invention, the ESD protection circuits previously described in connection with FIGS. 7–13 are fabricated in accordance with the ultrathin silicon on sapphire processes described in the above-cited reference.

The ESD protection circuits illustrated in FIGS. 12 and 13 (with and without ballast resistors 1112, 1113, 1133 and 1134) provide ESD protection in excess of 6000 volts. These protection circuits also provide this level of protection for different gate connections of primary diodes 1102 and 1103 and secondary diodes 1131 and 1132 (e.g., with the gate of diode 1102 connected to node 1115 or with the gate of diode 1103 connected to Vss voltage supply rail 1106). Existing SOI ESD protection circuits rarely exhibit 2000 volts HBM protection. An SOI ESD protection circuit in accordance with the present invention has been implemented in an area equal to the area typically required for a bulk CMOS ESD input protection circuit rated at 3500 volts ESD protection.

Although the invention has been described in connection with several embodiments, it is understood that this invention is not limited to the embodiments disclosed, but is capable of various modifications which would be apparent to one of ordinary skill in the art. Thus, the invention is limited only by the following claims.

What is claimed is:

1. An electrostatic discharge (ESD) protection circuit for protecting a silicon-on-insulator (SOI) integrated circuit formed over an insulating layer, the ESD protection circuit comprising:

an electrically conductive pad fabricated over the insulating layer;

a first conductor segment fabricated over the insulating layer, the first conductor segment connecting the pad directly to a first node;

a first voltage supply rail fabricated over the insulating layer;

a second voltage supply rail fabricated over the insulating layer;

a first diode fabricated over the insulating layer and connected between the first node and the first voltage supply rail;

a second diode fabricated over the insulating layer and connected between the first node and the second voltage supply rail; and a cross power supply clamp fabricated over the insulating layer, wherein the cross power supply clamp is connected between the first and second voltage supply rails, wherein the first node of the ESD protection circuit is coupled to a portion of the integrated circuit.

2. The ESD protection circuit of claim 1, further comprising:

a resistor fabricated over the insulating layer and coupled between the first node and an input buffer of the integrated circuit;

a second node located between the resistor and the input buffer;

a third diode fabricated over the insulating layer and connected between the second node and the first voltage supply rail; and a fourth diode fabricated over the insulating layer and connected between the second node and the second voltage supply rail.

3. The ESD protection circuit of claim 2, wherein the first and second diodes have larger current carrying capacities than the third and fourth diodes.

4. The ESD protection circuit of claim 2, wherein the first node is coupled to an output buffer of the integrated circuit through a resistor fabricated over the insulating layer.

5. The ESD protection circuit of claim 2, wherein the first node is connected directly to an output buffer of the integrated circuit.

6. The ESD protection circuit of claim 2, further comprising:

a first resistor fabricated over the insulating layer and connected in series with the third diode between the second node and the first voltage supply rail; and a second resistor fabricated over the insulating layer and connected in series with the fourth diode between the second node and the second voltage supply rail.

7. The ESD protection circuit of claim 1, wherein the ESD protection circuit is fabricated within a plurality of silicon islands formed over the insulating layer.

8. The ESD protection circuit of claim 7, wherein the first and second diodes are fabricated within a first silicon island.

9. The ESD protection circuit of claim 8, wherein the cross power supply clamp is fabricated within a second silicon island.

10. The ESD protection circuit of claim 8, wherein the cross power supply clamp is fabricated within a plurality of silicon islands.

11. The ESD protection circuit of claim 1, wherein the first and second diodes are gated lateral diodes.

12. The ESD protection circuit of claim 11, wherein at least one of the first and second diodes has a gate connected to the first node.

13. The ESD protection circuit of claim 11, wherein the first diode has a gate connected to the first voltage supply rail.

14. The ESD protection circuit of claim 1, wherein the first node is directly connected to an input buffer of the integrated circuit.

15. The ESD protection circuit of claim 14, wherein the first node is coupled to an output buffer of the integrated circuit through a resistor.

16. The ESD protection circuit of claim 1, wherein the cross power supply clamp comprises a first plurality of diodes fabricated over the insulating layer and coupled in series between the first and second voltage supply rails.

17. The ESD protection circuit of claim 16, wherein the cross power supply clamp further comprises at least one additional plurality of diodes fabricated over the insulating layer and coupled in series between the first and second voltage supply rails, wherein the first plurality of diodes is connected in parallel with the at least one additional plurality of diodes.

18. The ESD protection circuit of claim 1, wherein the cross power supply clamp comprises:

a first plurality of n-channel transistors fabricated over the insulating layer and connected in series between the first and second voltage supply rails, wherein a gate electrode of each n-channel transistor is coupled to a drain of the corresponding n-channel transistor.

19. The ESD protection circuit of claim 18, further comprising at least one additional plurality of n-channel transistors fabricated over the insulating layer and connected in series between the first and second voltage supply rails, wherein a gate electrode of each n-channel transistor of the second plurality of n-channel transistors is coupled to a drain of the corresponding n-channel transistor, and wherein the first plurality of n-channel transistors is connected in parallel with the at least one additional plurality of n-channel transistors.

20. The ESD protection circuit of claim 1, wherein the cross power supply clamp comprises:

a first plurality of p-channel transistors fabricated over the insulating layer and connected in series between the first and second voltage supply rails, wherein a gate electrode of each p-channel transistor is coupled to a drain of the corresponding p-channel transistor.

21. The ESD protection circuit of claim 20, further comprising at least one additional plurality of p-channel transistors fabricated over the insulating layer and connected in series between the first and second voltage supply rails, wherein a gate electrode of each p-channel transistor of the second plurality of p-channel transistors is coupled to a drain of the corresponding p-channel transistor, and wherein the first plurality of p-channel transistors is connected in parallel with the at least one additional plurality of p-channel transistors.

22. The ESD protection circuit of claim 1, wherein the first node is coupled to an output buffer of the integrated circuit through a resistor.

23. The ESD protection circuit of claim 1, wherein the first node is connected directly to an output buffer of the integrated circuit.

24. The ESD protection circuit of claim 1, further comprising:

a first resistor fabricated over the insulating layer and connected in series with the first diode between the first node and the first voltage supply rail; and a second resistor fabricated over the insulating layer and connected in series with the second diode between the first node and the second voltage supply rail.

25. The ESD protection circuit of claim 1, wherein the first and second diodes are non-gated lateral diodes.

26. The ESD protection circuit of claim 1, wherein the first and second diodes each comprise a combination of gated and non-gated lateral diodes.

27. The ESD protection circuit of claim 1, wherein the integrated circuit comprises a gate oxide layer fabricated over the insulating layer, wherein the gate oxide layer has a gate oxide breakdown voltage and the first and second diodes have reverse breakdown voltages, wherein the cross power supply clamp has a breakdown voltage which is less than or equal to the reverse breakdown voltages of the first and second diodes and the gate oxide breakdown voltage.

28. The ESD protection circuit of claim 1, wherein the cross power supply clamp comprises an n-channel transistor fabricated over the insulating layer and having a drain coupled to the first voltage supply rail and a source and a gate electrode coupled to the second voltage supply rail.

29. The ESD protection circuit of claim 1, wherein the cross power supply clamp comprises a plurality of n-channel transistors fabricated over the insulating layer, each transistor having a drain coupled to the first voltage supply rail, and a source and a gate electrode coupled to the second voltage supply rail.

30. The ESD protection circuit of claim 1, wherein the cross power supply clamp comprises a p-channel transistor fabricated over the insulating layer and having a source and a gate electrode coupled to the first voltage supply rail and a drain coupled to the second voltage supply rail.

31. The ESD protection circuit of claim 1, wherein the cross power supply clamp comprises a plurality of p-channel transistors fabricated over the insulating layer, each transistor having a source and a gate electrode coupled to the first voltage supply rail, and a drain coupled to the second voltage supply rail.

32. The ESD protection circuit of claim 1, wherein the cross power supply clamp comprises a plurality of zener diodes fabricated over the insulating layer and coupled in series between the first and second voltage supply rails.

33. The ESD protection circuit of claim 1, wherein the cross power supply clamp comprises:

an n-channel transistor fabricated over the insulating layer and having a drain and a gate electrode connected to the first voltage supply rail and a source connected to the second voltage supply rail, wherein the n-channel transistor has a threshold voltage greater than a voltage applied across the first and second voltage supply rails during normal operation of the integrated circuit.

34. The ESD protection circuit of claim 1, wherein the cross power supply clamp comprises:

a p-channel transistor fabricated over the insulating layer and having a source connected to the first voltage supply rail and a drain and a gate electrode connected to the second voltage supply rail, wherein the p-channel transistor has a threshold voltage greater than a voltage applied across the first and second voltage supply rails during normal operation of the integrated circuit.

35. The ESD protection circuit of claim 1, wherein the ESD protection circuit is fabricated in accordance with an ultrathin silicon on sapphire process.

36. A method for providing electrostatic discharge (ESD) protection for a silicon-on-insulator (SOI) integrated circuit, the method comprising the steps of:

connecting an electrically conductive pad of the SOI integrated circuit directly to an input buffer of the SOI integrated circuit;

conducting current from the pad to a first voltage supply rail through a forward biased SOI diode when a voltage applied to the pad is positive with respect to a voltage applied to the first voltage supply rail;

conducting current from a second voltage supply rail to the pad through a forward biased SOI diode when a voltage applied to the pad is negative with respect to a voltage applied to the second voltage supply rail;

conducting current from the first voltage supply rail to the second voltage supply rail through an SOI cross power supply clamp when a voltage applied to the first voltage supply rail is positive with respect to a voltage applied to the pad; and conducting current from the first voltage supply rail to the second voltage supply rail through the cross power supply clamp when a voltage applied to the pad is positive with respect to a voltage applied to the second voltage supply rail.

37. An electrostatic discharge (ESD) protection circuit for protecting a silicon-on-insulator (SOI) integrated circuit the ESD protection circuit comprising:

an electrically conductive pad;

a first conductor segment connecting the pad directly to a first node, wherein the first node is connected to a portion of the SOI integrated circuit;

a first voltage supply rail;

a second voltage supply rail;

a first SOI diode connected between the first node and the first voltage supply rail, wherein the first SOI diode is forward biased by a voltage applied to the pad which is positive with respect to a voltage applied to the first voltage supply rail;

a second SOI diode connected between the first node and the second voltage supply rail, wherein the second SOI diode is forward biased by a voltage applied to the pad which is negative with respect to a voltage applied to the second voltage supply rail; and an SOI clamping circuit directly connected between the first and second voltage supply rails, wherein the clamping circuit is forward biased by a voltage applied to the second voltage supply rail which is positive with respect to a voltage applied to the first voltage supply rail, and wherein the clamping circuit is reverse biased by a voltage applied to the first voltage supply rail which is positive with respect to a voltage applied to the second voltage supply rail.

* * * * *